United States Patent
Lewandowski et al.

(10) Patent No.: US 12,107,065 B2
(45) Date of Patent: Oct. 1, 2024

(54) UNIFORM CHIP GAPS VIA INJECTION-MOLDED SOLDER PILLARS

(71) Applicant: International Business Machines Corporation, Armonk, NY (US)

(72) Inventors: Eric Peter Lewandowski, White Plains, NY (US); Jae-Woong Nah, Closter, NJ (US); Dongbing Shao, Briarcliff Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 151 days.

(21) Appl. No.: 16/932,290

(22) Filed: Jul. 17, 2020

(65) Prior Publication Data
US 2022/0020715 A1    Jan. 20, 2022

(51) Int. Cl.
| | |
|---|---|
| H01L 23/00 | (2006.01) |
| H01L 25/18 | (2023.01) |
| H10N 60/81 | (2023.01) |

(52) U.S. Cl.
CPC .............. *H01L 24/17* (2013.01); *H01L 24/11* (2013.01); *H01L 24/81* (2013.01); *H01L 25/18* (2013.01);
(Continued)

(58) Field of Classification Search
None
See application file for complete search history.

(56) References Cited

U.S. PATENT DOCUMENTS

| | | |
|---|---|---|
| 6,444,921 B1 | 9/2002 | Wang et al. |
| 6,986,454 B2 | 1/2006 | Stillabower |

(Continued)

FOREIGN PATENT DOCUMENTS

WO    2018231241    12/2018

OTHER PUBLICATIONS

Foxen et al., "Qubit compatible superconducting interconnects," Quantum Sci. Technol. 3, https://web.physics.ucsb.edu/~martinisgroup/papers/Foxen2017.pdf, 2018, 11 pages.

(Continued)

*Primary Examiner* — Hung K Vu
(74) *Attorney, Agent, or Firm* — Amin, Turocy & Watson, LLP

(57) ABSTRACT

Systems and techniques that facilitate uniform qubit chip gaps via injection-molded solder pillars are provided. In various embodiments, a device can comprise one or more injection-molded solder interconnects. In various aspects, the one or more injection-molded solder interconnects can couple at least one qubit chip to an interposer chip. In various embodiments, the device can further comprise one or more injection-molded solder pillars. In various instances, the one or more injection-molded solder pillars can be between the at least one quit chip and the interposer chip. In various cases, the one or more injection-molded solder pillars can be in parallel with the one or more injection-molded solder interconnects. In various embodiments, the one or more injection-molded solder pillars can facilitate and/or maintain a uniform gap between the at least one qubit chip and the interposer chip. In various embodiments, a melting point of the one or more injection-molded solder pillars can be higher than a melting point of the one or more injection-molded solder interconnects. In various embodiments, the one or more injection-molded solder pillars can
(Continued)

be superconductors. In various embodiments, a yield strength of the one or more injection-molded solder pillars can be between 3,000 pounds per square inch and 15,000 pounds per square inch, which can be higher than a yield strength of the one or more injection-molded solder interconnects. In various embodiments, the one or more injection-molded solder pillars can be binary tin alloys, tertiary tin alloys, and/or quaternary tin alloys.

8 Claims, 18 Drawing Sheets

(52) U.S. Cl.
CPC .... *H10N 60/815* (2023.02); *H01L 2224/1131* (2013.01); *H01L 2224/11849* (2013.01); *H01L 2224/17177* (2013.01); *H01L 2224/17179* (2013.01); *H01L 2224/17505* (2013.01); *H01L 2224/81815* (2013.01); *H01L 2924/014* (2013.01)

(56) References Cited

U.S. PATENT DOCUMENTS

| | | | |
|---|---|---|---|
| 7,810,702 | B2 | 10/2010 | Cordes et al. |
| 8,476,773 | B2 | 7/2013 | Buchwalter et al. |
| 8,877,556 | B2 | 11/2014 | Nah et al. |
| 9,013,037 | B2 | 4/2015 | Jin |
| 9,095,081 | B1 | 7/2015 | Gruber et al. |
| 9,836,699 | B1 | 12/2017 | Rigetti et al. |
| 9,971,970 | B1 | 5/2018 | Rigetti et al. |
| 10,134,972 | B2 | 11/2018 | Oliver et al. |
| 2012/0020040 | A1 | 1/2012 | Lin et al. |
| 2013/0221519 | A1* | 8/2013 | Hwang ............ H01L 23/49811 257/737 |
| 2017/0141073 | A1* | 5/2017 | Lu ............................ H01L 24/05 |
| 2019/0162902 | A1* | 5/2019 | Barwicz ................... G02B 6/13 |
| 2019/0198474 | A1 | 6/2019 | Abraham et al. |
| 2020/0259064 | A1* | 8/2020 | Lewandowski ......... H01L 24/81 |

OTHER PUBLICATIONS

Siewert et al., "Properties of Lead-Free Solders Release 4.0," Database for Solder Properties with Emphasis on New Lead-free Solders, National Institute of Standards and Technology, Colorado School of Mines, Feb. 11, 2002, 77 pages.

Mei et al., "Low-Temperature Solders," Hewlett-Packard Journal, Article 10, Aug. 1996, 10 pages.

Rosenberg et al., "3D integrated superconducting qubits," arXiv:1706.04116v2 [quant-ph], Jun. 20, 2017, 6 pages.

Vahidpour et al., "Superconducting Through-Silicon Vias for Quantum Integrated Circuits," arXiv:1708.02226v1 [physics app-ph], Aug. 8, 2017, 5 pages.

* cited by examiner

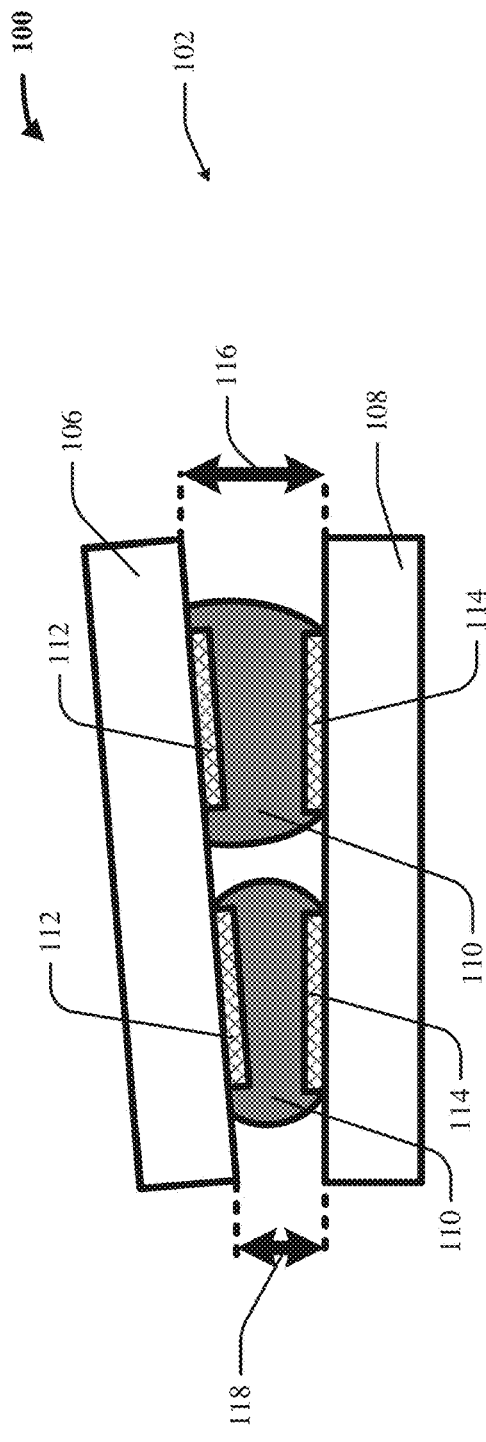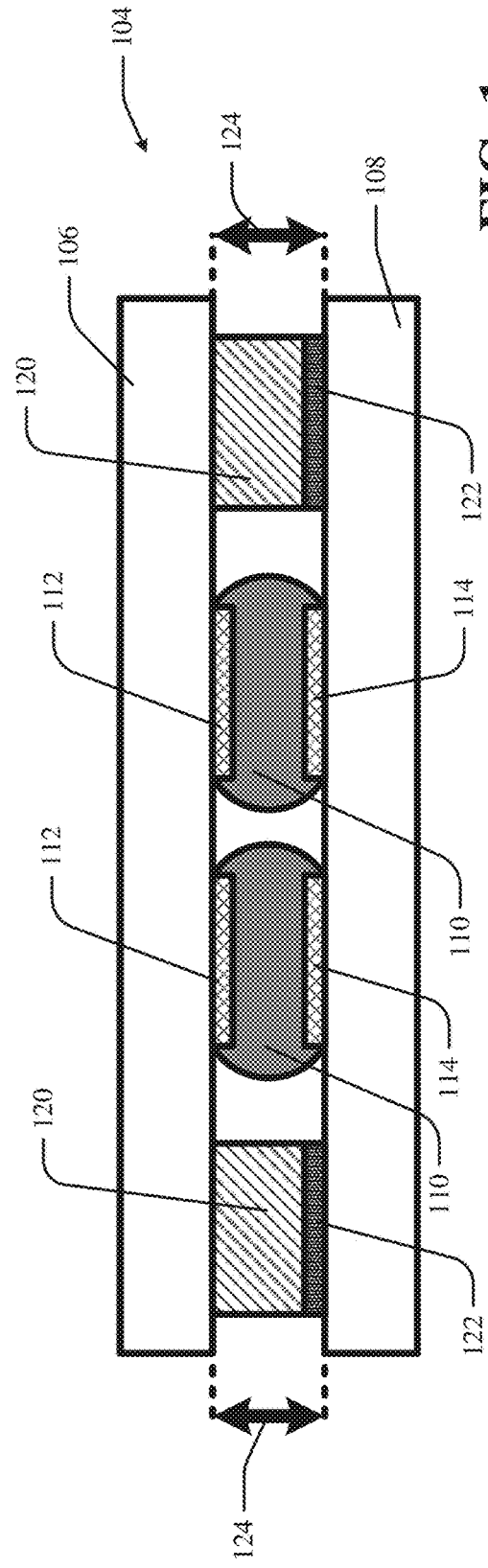
FIG. 1

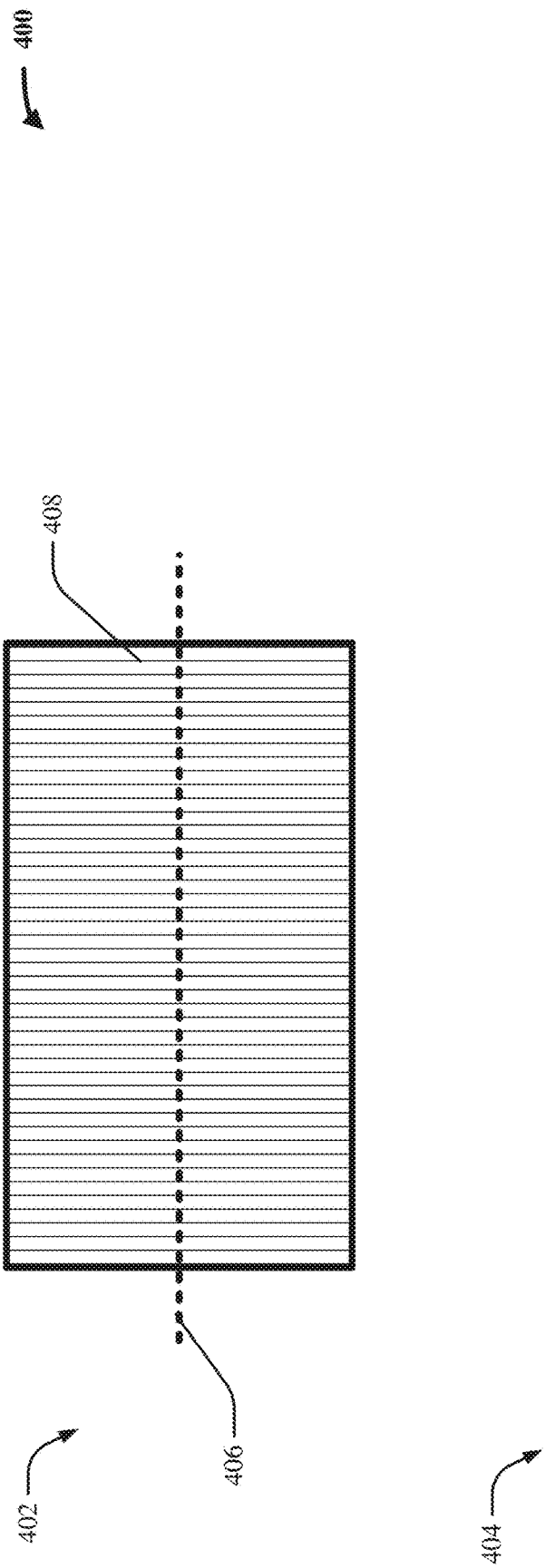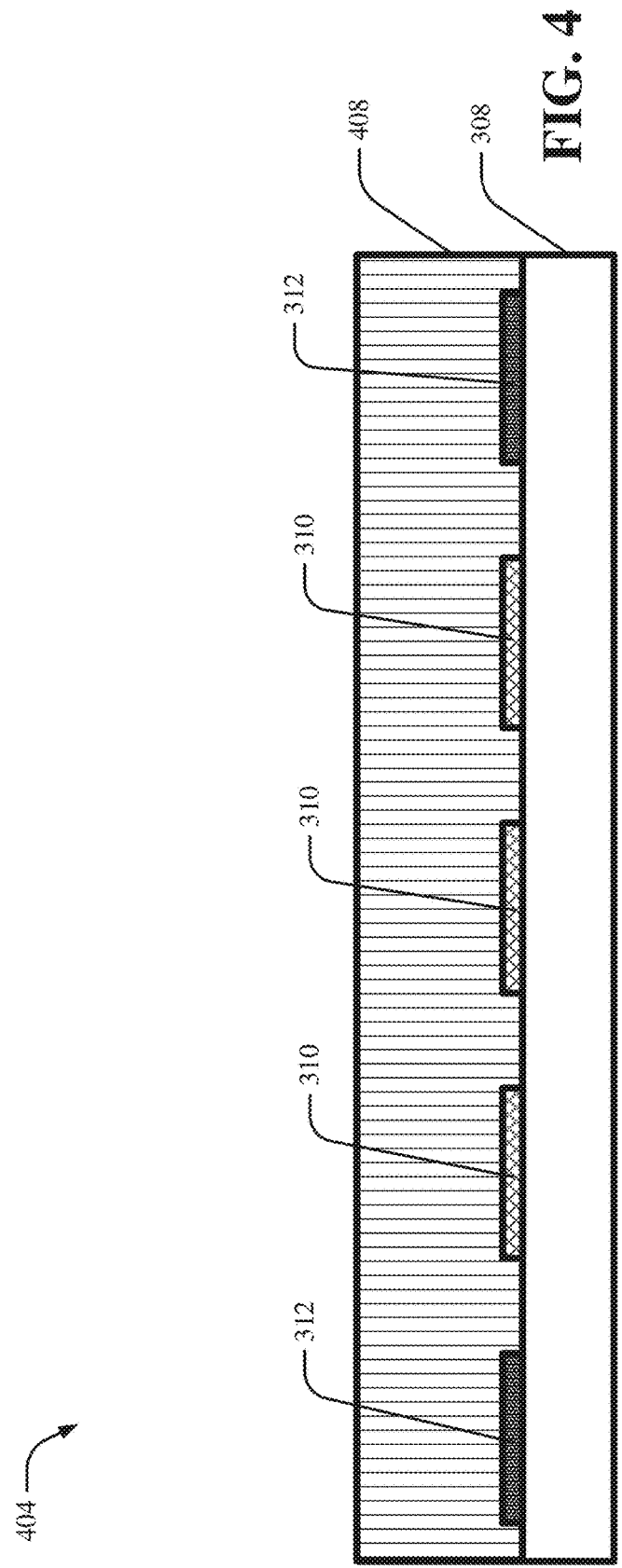
FIG. 4

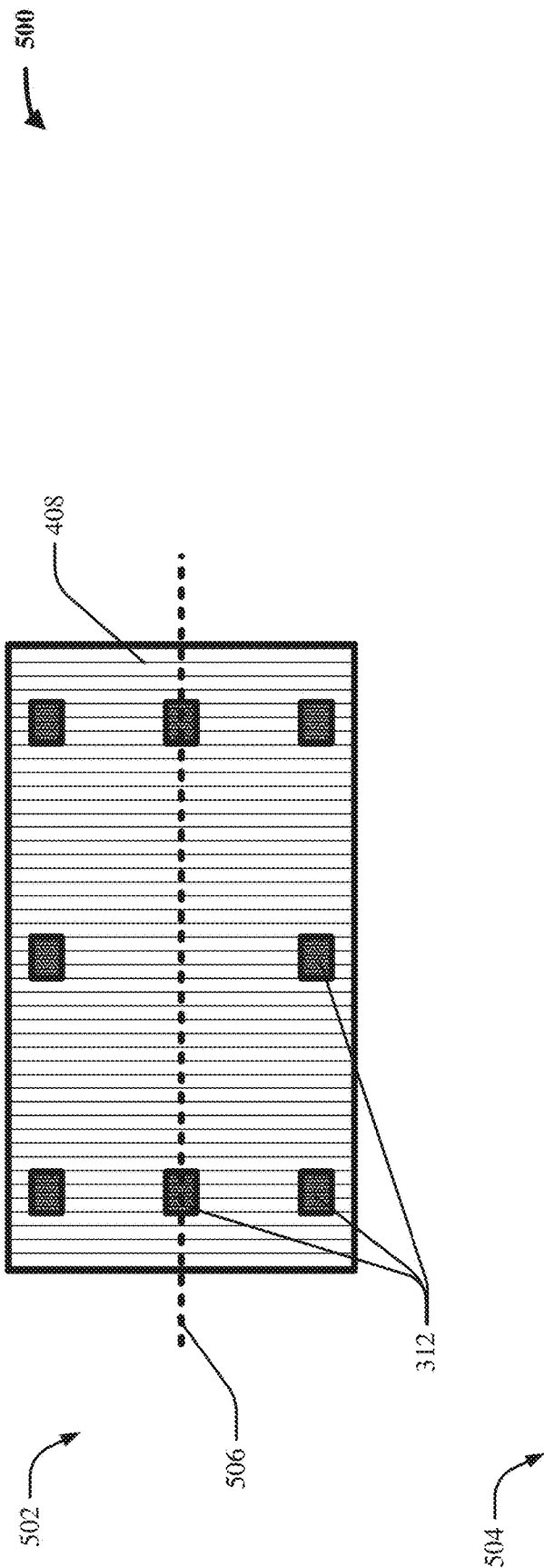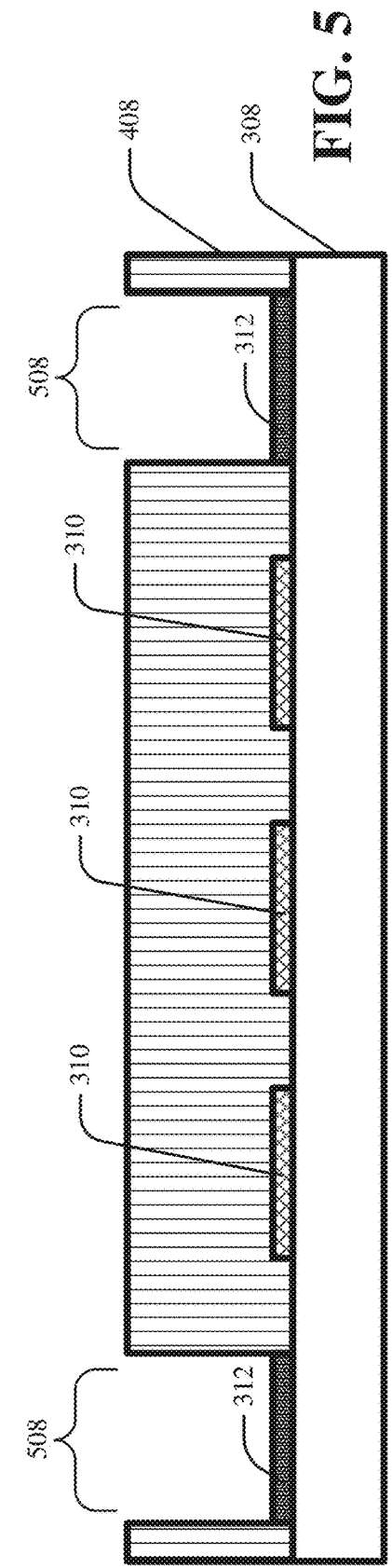
FIG. 5

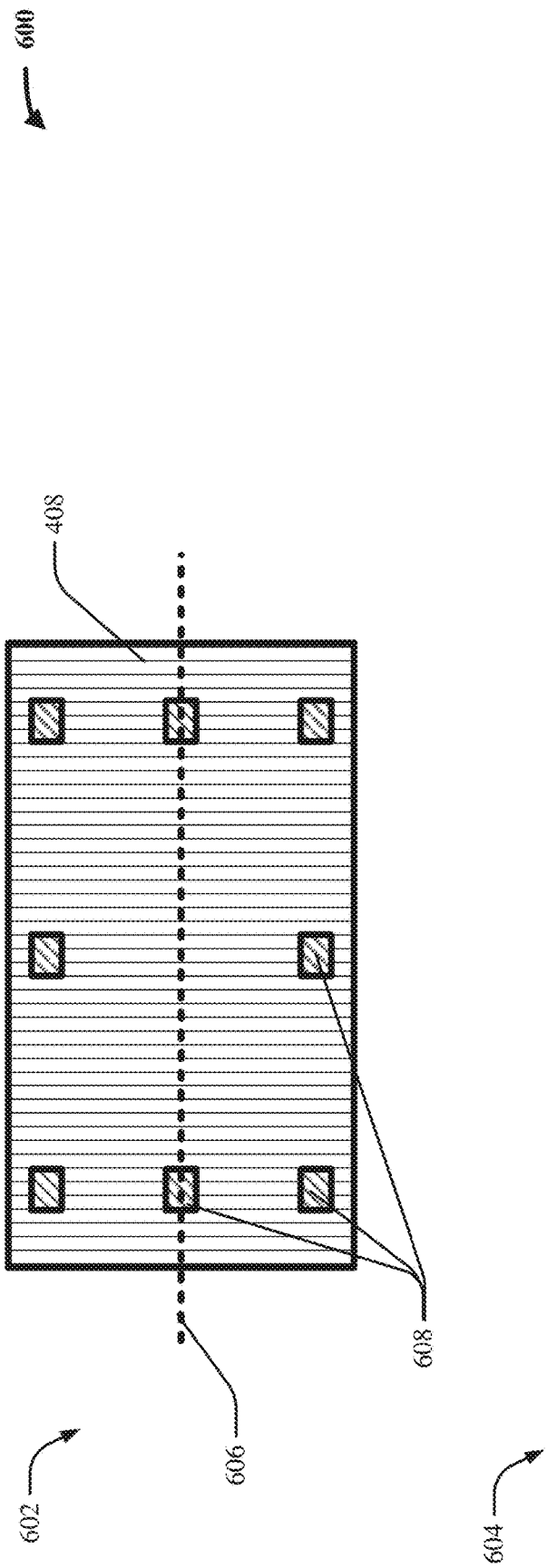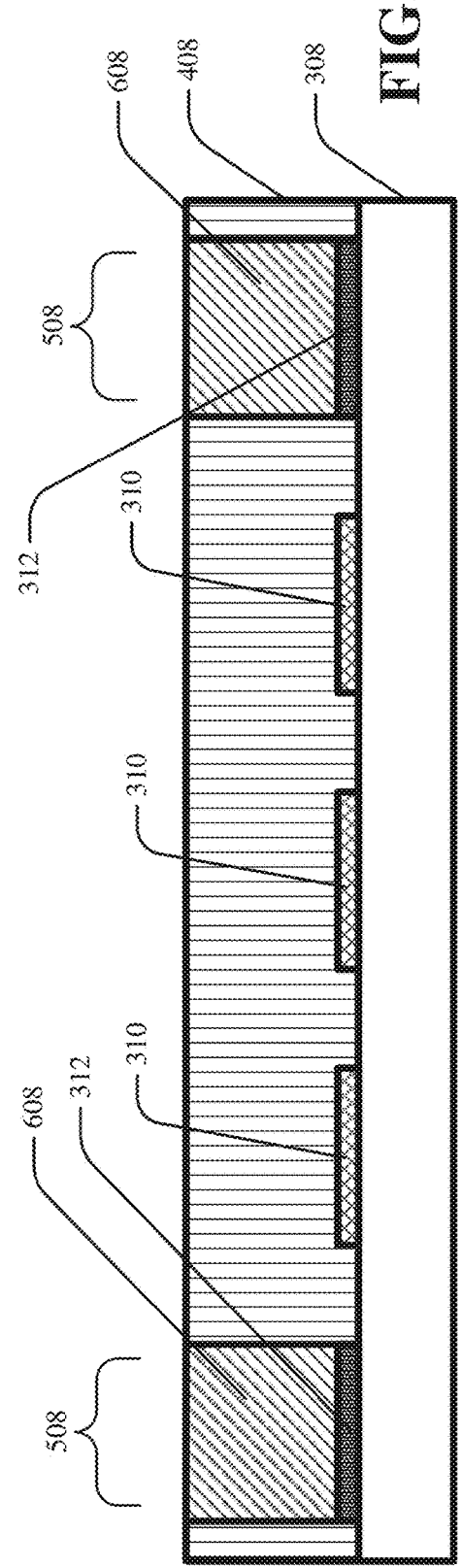
FIG. 6

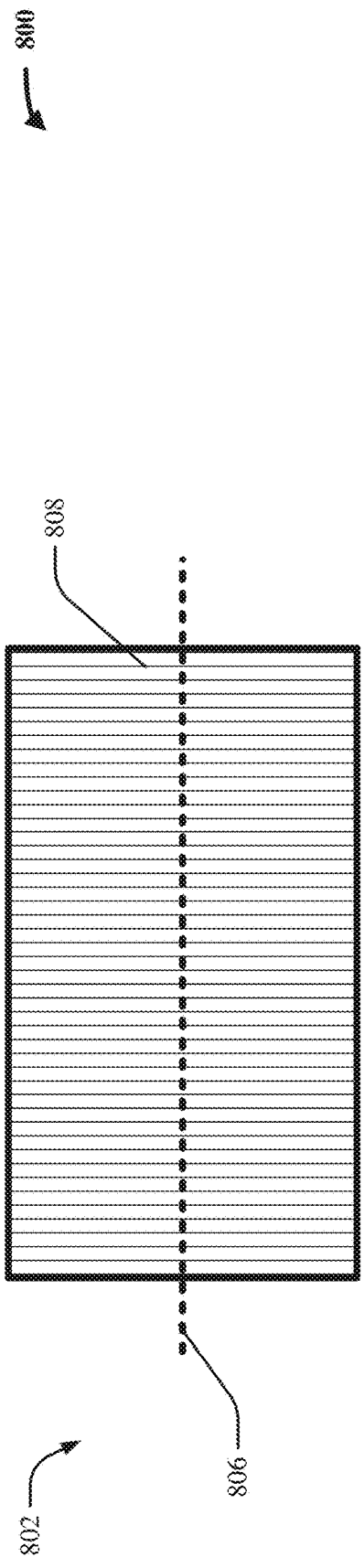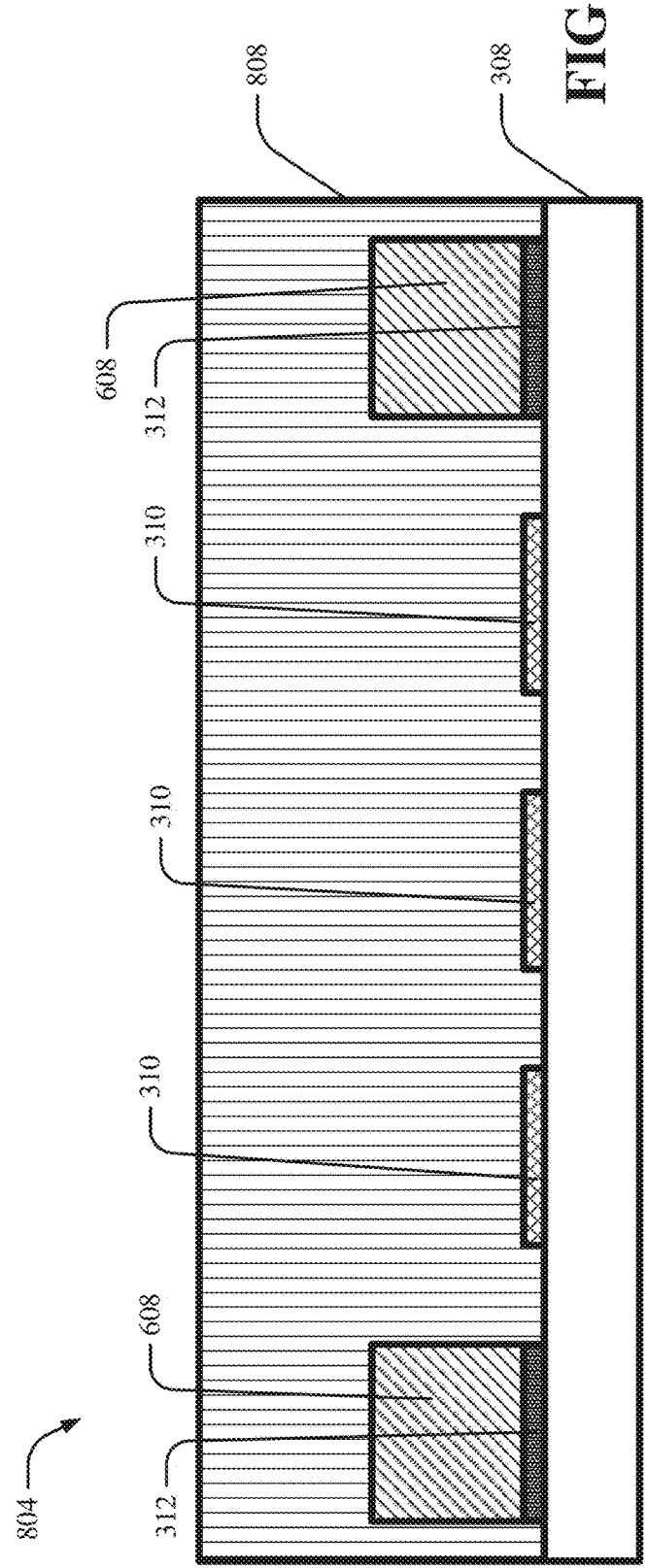
FIG. 8

UNIFORM CHIP GAPS VIA INJECTION-MOLDED SOLDER PILLARS

BACKGROUND

The subject disclosure relates generally to qubit chip gaps, and more specifically to facilitating uniform qubit chip gaps via injection-molded solder pillars.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus and/or computer program products that facilitate uniform qubit chip gaps via injection-molded solder pillars are described.

According to one or more embodiments, a device is provided. In various aspects, the device can comprise one or more injection-molded solder interconnects. In various instances, the one or more injection-molded solder interconnects can couple at least one qubit chip to an interposer chip. In various embodiments, the device can further comprise one or more injection-molded solder pillars. In various instances, the one or more injection-molded solder pillars can be between the at least one qubit chip and the interposer chip. In various aspects, the one or more injection-molded solder pillars can be in parallel with the one or more injection-molded solder interconnects. In various embodiments, the one or more injection-molded solder pillars can facilitate and/or maintain a uniform gap between the at least one qubit chip and the interposer chip. In various embodiments, a melting point of the one or more injection-molded solder pillars can be higher than a melting point of the one or more injection-molded solder interconnects. In various embodiments, the one or more injection-molded solder pillars can be superconductors. In various embodiments, a yield strength of the one or more injection-molded solder pillars can be between 3,000 pounds per square inch and 15,000 pounds per square inch, which can be higher than a yield strength of the one or more injection-molded solder interconnects. In various embodiments, the one or more injection-molded solder pillars can be binary tin alloys, tertiary tin alloys, or quaternary tin alloys.

According to one or more embodiments, a method is provided. In various instances, the method can comprise coupling at least one qubit chip to an interposer chip via one or more injection-molded solder interconnects. In various embodiments, the method can further comprise forming one or more injection-molded solder pillars between the at least one qubit chip and the interposer chip. In various aspects, the one or more injection-molded solder pillars can be in parallel with the one or more injection-molded solder interconnects. In various embodiments, the one or more injection-molded solder pillars can facilitate and/or maintain a uniform gap between the at least one qubit chip and the interposer chip. In various embodiments, a melting point of the one or more injection-molded solder pillars can be higher than a melting point of the one or more injection-molded solder interconnects. In various embodiments, the one or more injection-molded solder pillars can be superconductors. In various embodiments, a yield strength of the one or more injection-molded solder pillars can be between 3,000 pounds per square inch and 15,000 pounds per square inch, which can be higher than a yield strength of the one or more injection-molded solder interconnects. In various embodiments, the one or more injection-molded solder pillars can be binary tin alloys, tertiary tin alloys, or quaternary tin alloys.

According to one or more embodiments, an apparatus in provided. In various instances, the apparatus can comprise at least one quantum chip and an interposer. In various aspects, the at least one quantum chip can be coupled to the interposer via one or more injection-molded solder bumps. In various cases, the one or more injection-molded solder bumps can be at one or more first locations on the interposer. In various embodiments, the apparatus can further comprise one or more injection-molded solder backstops. In various cases, the one or more injection-molded solder backstops can be at one or more second locations on the interposer. In various instances, the one or more injection-molded solder backstops can facilitate and/or maintain a uniform separation between the at least one quantum chip and the interposer. In various embodiments, the one or more injection-molded solder backstops can be superconductors that have a yield strength between 3,000 pounds per square inch and 15,000 pounds per square inch. In various embodiments, the one or more injection-molded solder backstops can be binary tin alloys, tertiary tin alloys, or quaternary tin alloys. In various embodiments, the one or more injection-molded solder backstops can have a melting point that is greater than a melting point of the one or more injection-molded solder bumps.

DESCRIPTION OF THE DRAWINGS

FIG. 1 illustrates block diagrams of example, non-limiting quantum chip structures in accordance with one or more embodiments described herein.

FIGS. 3-13 collectively illustrate an exemplary, non-limiting fabrication process that can be implemented to create uniform chip gaps via injection-molded solder pillars in accordance with various embodiments described herein.

DETAILED DESCRIPTION

Figure 2:
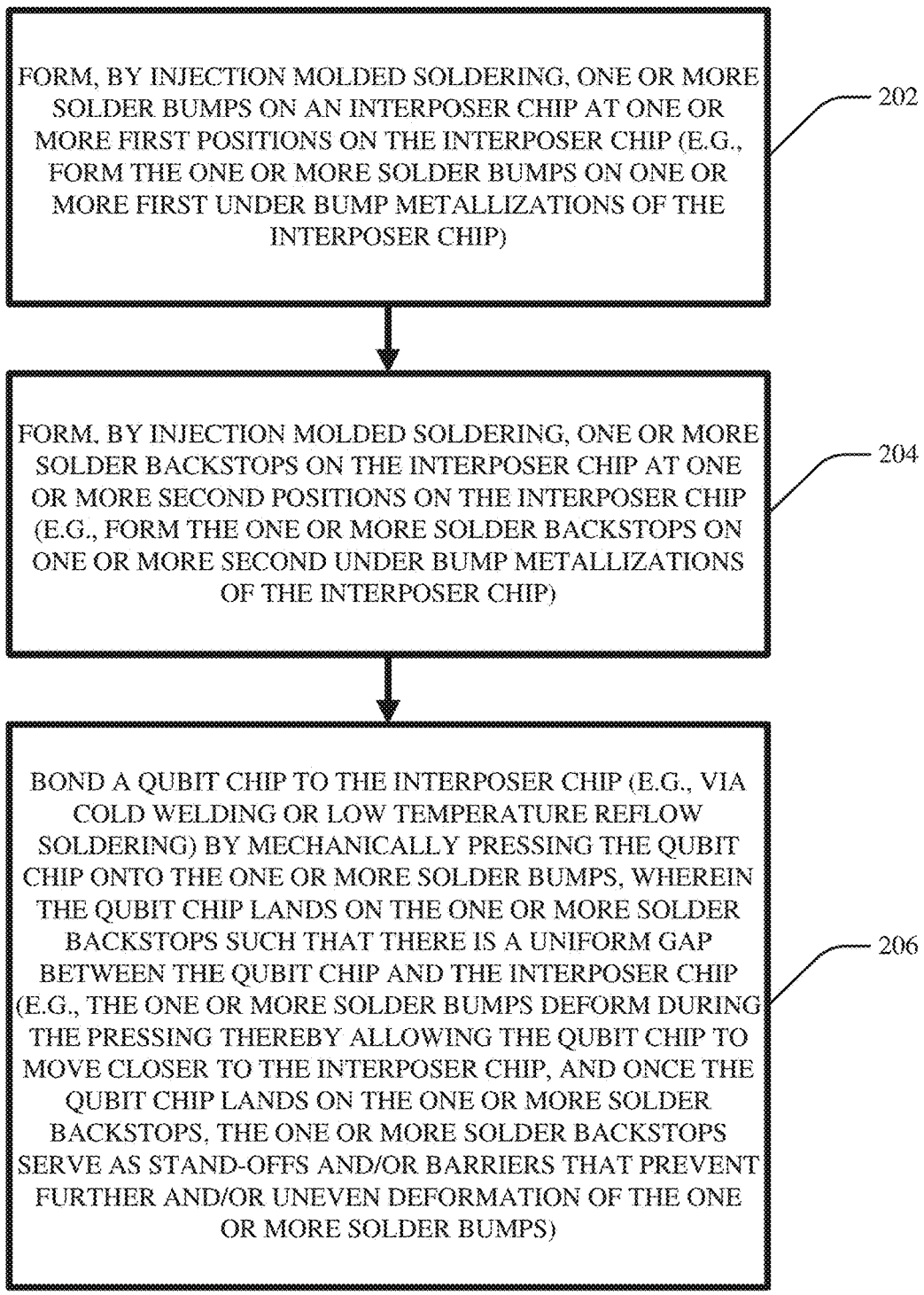
FIG. 2 illustrates a flow diagram of an example, non-limiting method that facilitates uniform qubit chip gaps via injection-molded solder pillars in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Quantum computing systems are an active area of innovation in computing technology. A quantum computing system can include one or more qubit chips (e.g., also called quantum chips) that are flip-chip bonded to and/or flip-chip packaged with one or more interposer chips. In various aspects, a qubit chip can be any suitable substrate (e.g., silicon) on which one or more superconducting qubit devices are fabricated (e.g., Josephson junctions, which are the fundamental building block of superconducting qubits, can be formed on a substrate via any suitable microfabrication and/or nanofabrication techniques such as evaporation/deposition). In various aspects, an interposer chip can be any suitable substrate (e.g., silicon) on which one or more integrated circuit elements are fabricated (e.g., resonators, waveguides, capacitors, inductors, input/output ports, under bump metallizations, and/or any other suitable integrated circuit elements to be used in conjunction with superconducting qubits can be fabricated on a substrate via any suitable microfabrication and/or nanofabrication techniques such as evaporation/deposition).

In various cases, to facilitate flip-chip bonding between a qubit chip and an interposer chip, cold welding and/or low temperature reflow soldering can be implemented to electrically couple the qubit chip to the interposer chip. In various aspects, cold welding, also called contact welding, can be a solid-state welding process in which joining of two materials occurs without fusion/heating at the interface of the two materials. In various instances, low temperature reflow soldering can be a solder process in which low levels of heat are applied to soldering materials that have low melting points. In various cases, cold welding and/or low temperature reflow soldering can be beneficial in coupling the qubit chip to the interposer chip, because Josephson junctions present on the qubit chip can be corrupted and/or damaged if exposed to high temperatures (e.g., in some cases, temperatures above 80 degrees Celsius can damage a Josephson junction, and conventional welding procedures can involve heating solder materials to many thousands of degrees Celsius). In various instances, cold welding and/or low temperature reflow soldering can involve mechanically pressing the qubit chip onto the interposer chip (e.g., so that contact pads of the qubit chip make contact with solder bumps and/or solder interconnects that are placed on the interposer chip). In some cases, the amount of force required to mechanically press the qubit chip onto the interposer chip during cold welding and/or low temperature reflow soldering can depend upon the size of the quit chip and/or the size of the interposer chip (e.g., more pressing force can be required to properly cold weld and/or low temperature reflow solder larger qubit chips than smaller qubit chips).

When the qubit chip is cold welded and/or reflow soldered onto the interposer chip in a flip-chip fashion/arrangement, the performance of the qubit chip can depend upon the gap and/or separation distance between the qubit chip and the interposer chip (e.g., the resonant frequencies, transition frequencies, and/or operational frequencies of the Josephson junctions on the qubit chip can change based on the distance separating the qubit chip from the interposer chip). In some cases, a non-uniform gap and/or a non-uniform separation distance between the qubit chip and the interposer chip can negatively affect the performance of the qubit chip (e.g., qubit chip performance can be improved when the plane of the qubit chip is substantially parallel to the plane of the interposer chip, and qubit chip performance can be degraded when the plane of the qubit chip is not substantially parallel to the plane of the interposer chip).

In various instances, coherence and/or other quantum performance of the qubit chip can be improved by increasing the physical size and/or top-side surface area of the qubit chip (e.g., qubit chips that are larger than 25 millimeters (mm) by 25 mm in top-side surface area can support greater numbers of Josephson junctions and thus greater numbers of qubits). However, as mentioned above, a higher pressing force can be required to cold weld and/or low temperature reflow solder a larger qubit chip to an interposer chip (e.g., since more qubit devices are on the larger qubit chip, more solder bumps and/or solder interconnects are involved, and thus more force can be required to form the solder bumps and/or the solder interconnects into proper solder bonds). Such higher forces can make it difficult to properly control the uniformity of the gap and/or separation distance between the qubit chip and the interposer chip. That is, a higher pressing force can make it more difficult and/or less likely to bond the qubit chip to the interposer chip such that the plane of the qubit chip is substantially parallel to the plane of the interposer chip, and a higher pressing force can make it less difficult and/or more likely to bond the qubit chip to the interposer chip such that the plane of the qubit chip is not substantially parallel to the plane of the interposer chip. Even in situations where an initially-uniform gap and/or separation distance is achieved during cold welding and/or low temperature reflow soldering, the low temperature and/or low modulus soldering materials (e.g., indium) that are used can be likely to experience creep over time. Such creep can cause the gap and/or separation distance between the qubit chip and the interposer chip to change over time, which can negatively affect the coherence and/or performance of the qubit chip. Moreover, such creep can cause the gap and/or separation distance to become uneven and/or nonuniform over time, which can further degrade the performance of the qubit chip. Furthermore, the vulnerability of low temperature and/or low modulus soldering materials to creep can cause such materials to function sub-optimally when exposed to compression during operation (e.g., direct thermalization schemes, chip stacking schemes, and/or area array socket schemes cannot be properly implemented when only low temperature and/or low modulus soldering materials are used because such schemes expose the low temperature and/or low modulus soldering materials to significant compressive stresses). Systems and/or techniques that can ameliorate one or more of these problems can be desirable.

Various embodiments of the invention can address one or more of these problems. In various aspects, embodiments of the invention can facilitate a uniform and/or substantially uniform (e.g., within a suitable measurement error and/or measurement resolution) gap and/or separation distance between a qubit chip and an interposer chip that are coupled in a flip-chip bonded fashion/arrangement via cold welding and/or low temperature reflow soldering. In other words, various embodiments of the invention can help to ensure that the qubit chip is not flip-chip bonded to the interposer chip in a tilted and/or slanted fashion. Instead, various embodiments of the invention can help to ensure that the qubit chip is flip-chip bonded to the interposer chip such that the plane of the qubit chip is parallel and/or substantially parallel with the plane of the interposer chip (e.g., such that there is a spatially uniform gap between the qubit chip and the interposer chip). By facilitating the formation of spatially uniform chip gaps and/or spatially uniform chip separation distances, various embodiments of the invention can improve the quantum performance (e.g., coherence) of the qubit devices (e.g., Josephson junctions) that are on the qubit chips. Thus, in various aspects, embodiments of the invention can improve the very performance of quantum computing systems.

To facilitate creating a spatially uniform chip gap and/or chip separation distance between a qubit chip and an interposer chip, various embodiments of the invention can involve forming two different kinds/types of solder structures between the qubit chip and the interposer chip. In various aspects, the first kind/type of solder structure can be one or more injection-molded solder interconnects (e.g., also called injection-molded solder bumps). The second kind/type of solder structure can be one or more injection-molded solder pillars (e.g., also called injection-molded solder backstops). In various aspects, the one or more injection-molded solder interconnects can exhibit a first melting temperature and a first yield strength. In various instances, the one or more injection-molded solder pillars can exhibit a second melting temperature and a second yield strength. In various cases, the first melting temperature can be less than the second melting temperature, and the first yield strength can be less than the second yield strength. In various embodiments, the one or more injection-molded solder interconnects can function as solder bonds that electrically couple the qubit chip to the interposer chip (e.g., that electrically couple one or more under bump metallizations on the qubit chip to one or more under bump metallizations on the interposer chip). In various instances, the one or more injection-molded solder pillars can function as solder backstops and/or solder stand-offs on which the qubit chip can land during cold welding and/or low temperature reflow soldering, and past which the qubit chip cannot move during cold welding and/or low temperature reflow soldering. In various aspects, the one or more injection-molded solder pillars can be in parallel with the one or more injection-molded solder interconnects rather than in series (e.g., each of the one or more injection-molded solder interconnects can make contact with the qubit chip and with the interposer chip, and each of the one or more injection-molded solder pillars can make contact with the qubit chip and with the interposer chip). That is, in various cases, the one or more injection-molded solder interconnects can be located at one or more first positions on the interposer chip and the one or more injection-molded solder pillars can be located at one or more second positions on the interposer chip, such that an injection-molded solder pillar is not at a same location and/or in a same solder joint on the interposer chip as an injection-molded solder interconnect. In various aspects, the one or more injection-molded solder interconnects can be taller than the one or more injection-molded solder pillars, before the initiation of a cold welding process and/or a low temperature reflow soldering process.

In various embodiments, when such solder structures are implemented during cold welding and/or low temperature reflow soldering of a qubit chip to an interposer chip, such solder structures can cause the qubit chip to be electrically coupled to the interposer chip with a spatially uniform gap and/or separation distance between the qubit chip and the interposer chip. Specifically, as mentioned above, prior to the initiation of the cold welding and/or the low temperature reflow soldering, the one or more injection-molded solder interconnects can be taller than the one or more injection-molded solder pillars. During the cold welding and/or the low temperature reflow soldering, the qubit chip can be mechanically pressed onto the interposer chip. Since the one or more injection-molded solder interconnects can be taller than the one or more injection-molded solder pillars, the qubit chip during such pressing can make contact with the one or more injection-molded solder interconnects before making contact with the one or more injection-molded solder pillars. During the pressing, the one or more injection-molded solder interconnects can be compressed and can deform (e.g., can plastically deform), thereby allowing the qubit chip to move closer to the interposer chip (e.g., thereby allowing the gap and/or separation distance between the qubit chip and the interposer chip to get smaller). In various aspects, the pressing can continue so that the qubit chip lands on and/or otherwise makes contact with the one or more injection-molded solder pillars. In various cases, the mechanical pressing of the qubit chip toward the interposer chip can be unable to deform (e.g., unable to plastically deform) the one or more injection-molded solder pillars (e.g., the amount of pressing force, the yield strength of the one or more injection-molded solder pillars, the geometry of the one or more injection-molded solder pillars, the yield strength of the one or more injection-molded solder interconnects, and the geometry of the one or more injection-molded solder interconnects can be chosen and/or selected so that the compressive stresses experienced by the one or more injection-molded solder pillars during the pressing do not exceed the yield strength of the one or more injection-molded solder pillars while the compressive stresses experienced by the one or more injection-molded solder interconnects during the pressing do exceed the yield strength of the one or more injection-molded solder interconnects). In such case, the qubit chip can cease and/or substantially cease moving toward the interposer chip even if application of the pressing force is continued (e.g., the gap and/or separation distance between the qubit chip and the interposer chip can stop being reduced once the qubit chip lands on and/or contacts the one or more injection-molded solder pillars, because the one or more injection-molded solder pillars can resist plastic deformation when compressed by the pressing force). Thus, in some cases, the one or more injection-molded solder pillars can be considered as providing a backstop that prevents further motion of the qubit chip. In some cases, the height of the one or more injection-molded solder pillars can define a minimum gap and/or separation distance between the qubit chip and the interposer chip (e.g., a gap and/or separation distance that is smaller than the height of the one or more injection-molded solder pillars cannot be achieved since the one or more injection-molded solder pillars can avoid plastically deforming during pressing of the qubit chip).

Moreover, in various embodiments, the one or more injection-molded solder pillars can be arranged on the interposer chip in any suitable pattern, shape, arrangement, and/or fashion so that the gap and/or separation distance between the qubit chip and the interposer chip is spatially uniform and/or spatially even. For instance, the one or more injection-molded solder pillars can be arranged to make contact along the center and/or perimeter of the qubit chip so that the plane of the qubit chip is parallel and/or even with the plane of the interposer chip (e.g., if the qubit chip has four sides, the one or more injection-molded solder pillars can be arranged so as to make contact with the four sides of the qubit chip, such that each of the four sides of the qubit chip can be at a same separation distance from the surface of the interposer chip, which separation distance can be equal to the height of the one or more injection-molded solder pillars).

Note that various embodiments of the invention can provide for a uniform gap and/or separation distance even if the qubit chip becomes unevenly tiled and/or slanted during the mechanical pressing. Specifically, if the qubit chip is unevenly tilted and/or slanted during the mechanical pressing, then a first portion (e.g., end, edge, side, surface) of the qubit chip can make contact with the one or more injection-molded solder pillars before a second portion (e.g., end, edge, side, surface) of the qubit chip can make contact with the one or more injection-molded solder pillars. In such case, a first gap and/or separation distance between the first portion of the qubit chip and the interposer chip can be smaller than a second gap and/or separation distance between the second portion of the qubit chip and the interposer chip (e.g., since the qubit chip is tilted and/or slanted, the second portion of the qubit chip can be at a higher elevation than the first portion of the qubit chip). Because the first portion of the qubit chip is in contact with the one or more injection-molded solder pillars, the first portion of the qubit chip cannot move closer to the interposer chip (e.g., the one or more injection-molded solder pillars can avoid plastically deforming during the pressing). Additionally, because the second portion of the qubit chip is not yet in contact with the one or more injection-molded solder pillars, the second portion of the qubit chip can move closer to the interposer chip (e.g., the one or more injection-molded solder pillars can avoid plastically deforming during the pressing, but they cannot yet prevent further motion of the second portion of the qubit chip since they are not yet contacting the second portion of the qubit chip). In various cases, at some time during the pressing, the second portion of the qubit chip can come into contact with the one or more injection-molded solder pillars, at which time the one or more injection-molded solder pillars can prevent further motion of the second portion of the qubit chip. Note that, at this time, the second gap and/or separation distance between the second portion of the qubit chip and the interposer chip can be equal and/or substantially equal to the first gap and/or separation distance between the first portion of the qubit chip and the interposer chip (e.g., both the first gap and the second gap can be equal and/or substantially equal to the height of the one or more injection-molded solder pillars, since both the first portion of the qubit chip and the second portion of the qubit chip are contacting the one or more injection-molded solder pillars). Thus, the result can be a spatially uniform and/or even gap between the qubit chip and the interposer chip, notwithstanding the fact that the qubit chip became tilted and/or slanted during the mechanical pressing.

Furthermore, note that embodiments of the invention can provide for a uniform gap and/or separation distance even when heat is applied, such as during low temperature reflow soldering. Specifically, during low temperature reflow soldering, heat can be applied at a temperature that is above the melting temperature of the one or more injection-molded solder interconnects and that is below the melting temperature of the one or more injection-molded solder pillars. In such case, the one or more injection-molded solder interconnects can liquify and/or experience a phase change while the one or more injection-molded solder pillars can avoid liquifying and/or avoid experiencing a phase change. Because the one or more injection-molded solder interconnects can liquify, a lower pressing force can be needed to mechanically press the qubit chip to the interposer chip (e.g., a lower pressing force can be needed to plastically deform the one or more injection-molded solder interconnects when the one or more injection-molded solder interconnects are above their melting temperature). In some cases, no external pressing force can be applied; instead, gravity can be used. Just as described above, the one or more injection-molded solder interconnects can plastically deform and/or get shorter during the low temperature reflow process, thereby allowing the qubit chip to get closer to the interposer chip (e.g., thereby allowing the gap and/or separation distance between the qubit chip and/or the interposer chip to get smaller). In various cases, once the qubit chip lands on and/or otherwise makes contact with the one or more injection-molded solder pillars, the qubit chip can be prevented from moving closer to the interposer chip (e.g., since the reflow process is being conducted below the melting temperature of the one or more injection-molded solder pillars, the one or more injection-molded solder pillars can avoid liquifying and/or melting and thus can prevent further motion of the qubit chip). Thus, a spatially uniform and/or spatially even gap and/or separation distance between the qubit chip and the interposer chip can be facilitated (e.g., the gap and/or separation distance can be equal and/or substantially equal to the height of the one or more injection-molded solder pillars). Just as described above, such a spatially uniform and/or spatially even gap and/or separation distance can be facilitated even if the qubit chip becomes tilted, slanted, and/or uneven during the reflow process (e.g., if a first portion of the qubit chip contacts the one or more injection-molded solder pillars before a second portion of the qubit chip does so, the first portion can be prevented from moving closer to the interposer chip by the one or more injection-molded solder pillars while the second portion moves closer to the interposer chip; once the second portion also makes contact with the one or more injection-molded solder pillars, all portions of the qubit chip are at a uniform distance away from the surface of the interposer chip, that uniform distance being equal to the height of the one or more injection-molded solder pillars).

Overall, as mentioned above, various embodiments of the invention can involve utilizing two different kinds and/or types of soldering materials/structures to couple a qubit chip to an interposer chip. In various aspects, these two different kinds and/or types of soldering materials/structures can facilitate the creation of a spatially uniform gap and/or separation distance between the qubit chip and the interposer chip. The first kind and/or type of soldering material/structure can be the one or more injection-molded solder interconnects, and the second kind and/or type of soldering material/structure can be the one or more injection-molded solder pillars. In various aspects, the material properties and/or geometries of the one or more injection-molded solder interconnects and the material properties and/or geometries of the one or more injection-molded solder pillars can be chosen and/or selected, as described herein, such that the one or more injection-molded solder interconnects plastically deform during cold welding and/or during low temperature reflow soldering of the qubit chip to the interposer chip, and such that the one or more injection-molded solder pillars do not plastically deform during cold welding and/or during low temperature reflow soldering of the qubit chip to the interposer chip. In various cases, the one or more injection-molded solder interconnects can electrically couple the qubit chip to the interposer chip (e.g., can electrically couple one or more under bump metallizations of the interposer chip to one or more corresponding under bump metallizations on the qubit chip). In various aspects, the one or more injection-molded solder pillars can serve as backstops on which the qubit chips can land during cold welding and/or low temperature reflow soldering, and which can keep the qubit chip at a minimum distance away from the interposer chip (e.g., the gap and/or separation distance between the qubit chip and the interposer chip can be equal to and/or substantially equal to the height of the one or more injection-molded solder pillars when the qubit chip is pressed against the one or more injection-molded solder pillars). In various instances, the one or more injection-molded solder pillars can be arranged and/or positioned on the interposer chip so as to evenly support the qubit chip (e.g., so that all sides of the qubit chip and/or a central region of the qubit chip can be supported by the one or more injection-molded solder pillars). Thus, a spatially even and/or spatially uniform gap between the qubit chip and the interposer chip can be achieved. Moreover, the material properties (e.g., yield strength) of the one or more injection-molded solder pillars can be chosen and/or selected so that the one or more injection-molded solder pillars are not significantly vulnerable to creep over time. Thus, the spatially uniform gap and/or separation distance between the qubit chip and the interposer chip can be prevented from changing over time and/or from becoming uneven and/or nonuniform over time (e.g., because the qubit chip rests on the one or more injection-molded solder pillars, and because the one or more injection-molded solder pillars can have a higher yield strength as compared to the one or more injection-molded solder interconnects, the qubit chip will not move closer to the interposer chip even if the one or more injection-molded solder interconnects experience creep).

To facilitate such functionality, the one or more injection-molded solder pillars can comprise tertiary tin alloys and/or quaternary tin alloys that are fabricated and/or formed onto a substrate via injection-molded soldering. In various aspects, tertiary tin alloys (e.g., comprising tin (Sn), silver (Ag), and bismuth (Bi); and/or tin, silver, and zinc (Zn); and/or tin, silver, and indium (In); and/or tin, silver, and copper (Cu)) and/or quaternary tin alloys (e.g., comprising tin, silver, bismuth, and indium; and/or tin, silver, bismuth, and copper; and/or tin, silver, copper, and antimony (Sb)) can exhibit high yield strengths (e.g., between 3,000 pounds per square inch (psi) and 15,000 psi) while simultaneously being amendable to injection-molded soldering. In some cases, quinary tin alloys (e.g., comprising tin, silver, bismuth, copper, and antimony; and/or tin, silver, bismuth, indium, and antimony) can exhibit comparably high yield strengths and comparable amenability to injection-molded soldering. Moreover, in various aspects, such tertiary, quaternary, and/or quinary tin alloys can exhibit melting temperatures that are above the melting temperatures of low temperature reflow soldering materials (e.g., indium). Furthermore, such tertiary, quaternary, and/or quinary tin alloys can exhibit superconductivity, which can help to reduce interference with the qubit chip (e.g., non-superconducting pillars and/or backstops can interfere with the capacitances and/or coherences of Josephson junctions on the qubit chip, whereas superconducting pillars and/or backstops can avoid interfering with the capacitances and/or coherences of Josephson junctions on the qubit chip).

In various aspects, since such tertiary, quaternary, and/or quinary tin alloys can exhibit significantly high yield strengths (e.g., between 3,000 psi and 15,000 psi), the one or more injection-molded solder pillars can be fabricated so as to take up minimal space and/or real estate on the interposer chip and/or the qubit chip. After all, the compressive axial load bearing capacity of a structure can be a function of yield strength and cross-sectional area, such that smaller cross-sectional areas can be implemented when higher yield strengths are implemented. Since the one or more injection-molded solder pillars can have high yield strengths, they can have commensurately low cross-sectional areas, which can save real estate on the interposer chip and/or the qubit chip. Moreover, since such tertiary, quaternary, and/or quinary tin alloys can be amenable to injection molding, they can be fabricated and/or patterned into any suitable shapes and/or geometries (e.g., the one or more injection-molded solder pillars can be fabricated with circular, rectilinear, triangular, polygonal, elliptical, concave, convex, and/or arbitrary cross-sectional areas). Furthermore, fabrication of the one or more injection-molded solder pillars from such tertiary, quaternary, and/or quinary tin alloys can be performed without negatively impacting quantum performance of the qubit chip. Specifically, because injection molding can be used to form the one or more injection-molded solder pillars, the one or more injection-molded solder pillars can be formed without using blanket seeds and/or seed strips, can be formed at the end of an integration and/or fabrication sequence such as after wiring patterning, and/or can be fabricated without impacting wiring regions and/or dielectric regions of the qubit chip and/or the interposer chip. Further still, such tertiary, quaternary, and/or quinary tin alloys can exhibit high resilience and low brittleness, such that the one or more injection-molded solder pillars can be formed with high aspect ratios (e.g., the one or more injection-molded solder pillars can be any suitable height, such as 10 micrometers ($\mu$m) tall, 100 $\mu$m tall, and/or any suitable height within that range such as 50 $\mu$m tall and/or 60 $\mu$m tall).

In various instances, fabricating the one or more injection-molded solder pillars from such tertiary, quaternary, and/or quinary tin alloys can facilitate advantages over other types of pillar structures. For instance, pillar structures fabricated using deep reactive ion etching (DRIE) can result in pillars that are too brittle (e.g., patterning sharp corners into the pillars and/or patterning a high aspect ratio into the pillars would significantly increase the likelihood of fracturing the pillar structures if DRIE is used). Moreover, DRIE would have to be performed prior to wiring patterning in an integration and/or fabrication flow, which can render the subsequent wiring patterning very difficult (e.g., wiring patterning can be very difficult to perform when pillar structures on the order of 60 $\mu$m tall and/or taller are already fabricated on the substrate). As another instance, pillar structures fabricated from plated solders require the use of seed layers, which can negatively impact performance of the qubit chip, as mentioned above. Additionally, plated solders often exhibit large relative volume and/or height variations and can only be implemented with mono-composition and/or binary composition solder alloys, which often do not exhibit sufficiently high yield strengths for stand-off and/or backstop purposes. Furthermore, plated solders can exhibit poor uniformity and can thus require reflow to minimize non-uniformities. However, such reflow can cause the plated solder to ball up, which can alter its footprint/cross-sectional area, thereby negatively affecting its ability to function as a stand-off and/or backstop. As still another instance, pillar structures fabricated from evaporated solders can similarly require reflow (e.g., reflow can cause the evaporated solder to ball up). Moreover, the dimensions and/or geometries of pillar structures fabricated from evaporated solders can be severely limited. In particular, it can be very difficult to evaporate structures that are taller than 60 µm in height. Although metal shadow masks can be used to evaporate tall structures, the metal shadow masks can limit the lateral dimensions of the structures to around only 100 µm. Moreover, if lift-off resists are used in conjunction with evaporated solders, heights can be limited to the range of 1 µm to 10 µm.

In various aspects, implementing injection-molded soldering to fabricate the one or more injection-molded solder pillars from tertiary, quaternary, and/or quinary tin alloys, as described herein, can ameliorate one or more of these technical problems. Specifically, the one or more injection-molded solder pillars can be formed on the interposer chip (e.g., on one or more under bump metallizations of the interposer chip) in a first injection-molded soldering process. In various cases, the one or more injection-molded solder interconnects can be formed on the interposer chip (e.g., on one or more other under bump metallizations of the interposer chip) in a second injection-molded soldering process. In various aspects, this can be considered as a two-step, sequential injection-molded soldering process overall. In various instances, the composition of the one or more injection-molded solder pillars can be chosen and/or selected so that the one or more injection-molded solder pillars do not reflow during the second injection-molded soldering process (e.g., the melting temperature of the one or more injection-molded solder pillars can be higher than the melting temperature of the one or more injection-molded solder interconnects). Moreover, in various aspects, the composition of the one or more injection-molded solder pillars can be chosen and/or selected such that the one or more injection-molded solder pillars do not substantially and/or significantly deform (e.g., do not plastically deform) during bonding of the qubit chip to the interposer chip (e.g., during cold welding and/or low temperature solder reflow). As mentioned above, such functionality can be achieved by implementing binary, tertiary, quaternary, quinary, and/or higher-component tin alloys to form the one or more injection-molded solder pillars. Such tin alloys can exhibit sufficiently high yield strengths (e.g., between 3,000 psi and 15,000 psi, inclusively) so that plastic deformation of the one or more injection-molded solder pillars is avoided during bonding and so that small and/or minimal cross-sectional areas of the one or more injection-molded solder pillars can be used. Moreover, such tin alloys can exhibit sufficiently high melting temperatures such that they will not reflow during injection molding of the injection-molded solder interconnects (e.g., the injection-molded solder interconnects can be fabricated from any suitable low temperature solder material such as indium). This can allow the one or more injection-molded solder pillars to exhibit high aspect ratios (e.g., can have cross-sectional areas with a radius of curvature on the order of its height) and can be formed into complicated and/or arbitrarily shaped geometries. Furthermore, fabricating the one or more injection-molded solder pillars from such tin alloys can be performed without seed layers and can be performed last in an integration flow (e.g., after wiring patterning).

In various aspects, the composition of the one or more injection-molded solder interconnects can depend upon the bonding method used to couple the qubit chip to the interposer chip, and can be chosen and/or selected such that the melting temperature of the one or more injection-molded solder interconnects is lower than the melting temperature of the one or more injection-molded solder pillars. For instance, if cold welding is used, the one or more injection-molded solder interconnects can be formed from indium and/or any other suitable cold welding soldering material. If low temperature reflow soldering is used, the one or more injection-molded solder interconnects can be formed from any suitable low temperature solder material depending upon the thermal budget and/or any applicable thermomechanical constraints.

In various aspects, the one or more injection-molded solder pillars can be formed on one or more first under bump metallizations of the interposer chip. Similarly, the one or more injection-molded solder interconnects can be formed on one or more second under bump metallizations on the interposer chip. In various aspects, the one or more first under bump metallizations can have any suitable under bump metallization composition, which can depend upon the composition of the one or more injection-molded solder pillars (e.g., to avoid under bump metallization consumption) and/or on electrical performance (e.g., to provide a low loss connection). Similarly, in various cases, the one or more second under bump metallizations can have any suitable under bump metallization composition, which can depend upon the composition of the one or more injection-molded solder interconnects (e.g., to avoid under bump metallization consumption) and/or on electrical performance (e.g., to provide a low loss connection). In some aspects, the one or more first under bump metallizations and the one or more second under bump metallizations can be formed from the same materials and/or from different materials.

Various embodiments of the invention include novel systems and/or techniques for facilitating uniform qubit chip gaps via injection-molded solder pillars that are not abstract, that are not natural phenomena, that are not laws of nature, and that cannot be performed as a set of mental acts by a human. Instead, various embodiments of the invention include systems and/or techniques for facilitating a spatially-uniform and/or spatially-even gap between a qubit chip and an interposer chip that are bonded in flip-chip fashion. The quantum performance of a qubit chip can depend upon the size and/or the uniformity of the gap separating the qubit chip from an interposer chip when the qubit chip is coupled in a flip-chip arrangement to the interposer chip. In various instances, it can be difficult to create a desired and/or uniform gap during cold welding and/or during low temperature reflow soldering of the qubit chip to the interposer chip, especially when large qubit chips are involved. Moreover, even if a desired and/or uniform chip gap is initially achieved, it can be nonuniformly changed over time due to creep of low temperature solder materials. Various embodiments of the invention can address these problems. Specifically, one or more injection-molded solder interconnects can couple a qubit chip to an interposer chip, and one or more injection-molded solder pillars can be between the qubit chip and the interposer chip and can be in parallel with the one or more injection-molded solder interconnects. In various aspects, the one or more injection-molded solder interconnects can serve to electrically couple qubit chip to the interposer chip, and the one or more injection-molded solder pillars can serve as backstops and/or stand-offs which can maintain a constant, desired, and/or uniform separation distance between the qubit chip and the interposer chip. In various cases, during cold welding and/or low temperature reflow soldering, the qubit chip can be pressed toward the interposer chip. During such pressing, the qubit chip can land on the one or more injection-molded solder pillars. In various cases, a composition of the one or more injection-molded solder pillars can be chosen and/or selected so that the one or more injection-molded solder pillars do not plastically deform and/or melt during the cold welding and/or the low temperature reflow soldering. Because the one or more injection-molded solder pillars do not plastically deform and/or melt during the bonding procedure, the pressing can be prevented from moving the qubit chip closer to the interposer chip once the qubit chip makes contact with the one or more injection-molded solder pillars. That is, the qubit chip can be maintained at a desired distance from the interposer chip by being pressed against the one or more injection-molded solder pillars, with that desired distance being equal to and/or substantially equal to the height of the one or more injection-molded solder pillars. In some cases, the one or more injection-molded solder pillars can be arranged so as to evenly and/or uniformly maintain the qubit chip at the desired height (e.g., the one or more injection-molded solder pillars can be positioned so as to evenly support all sides of the qubit chip). In various cases, tertiary, quaternary, and/or quinary tin alloys can be used to form the one or more injection-molded solder pillars. In such case, the one or more injection-molded solder pillars can exhibit a sufficiently high yield strength to avoid deforming during cold welding, can exhibit a sufficiently high melting temperature to avoid melting during low temperature reflow soldering, can exhibit superconductivity, can be formed without seed layers, can be formed after wiring patterning, and/or can be formed into any suitable and/or desired geometry (e.g., from 10 µm tall to 100 µm tall; with any suitable cross-sectional area and/or cross-sectional shape). Moreover, with such compositions, the one or more injection-molded solder pillars can be not vulnerable and/or can be significantly less vulnerable to creep. Thus, the one or more injection-molded solder pillars can facilitate a spatially-uniform gap between the qubit chip and the interposer chip, and can maintain that spatially-uniform gap even if the one or more injection-molded solder interconnects experience creep. Overall, various embodiments of the invention constitute novel soldering architectures and/or structures that can facilitate and/or maintain a spatially-uniform gap between a qubit chip and an interposer chip that are bonded in a flip-chip arrangement. Since a uniform gap can benefit the quantum performance of the qubit chip, various embodiments of the invention can improve the performance and/or functioning of a quantum computing system. Therefore, embodiments of the invention constitute concrete and tangible technical improvements in the field of quantum computing fabrication.

In various aspects, it should be appreciated that the figures of this disclosure are exemplary and non-limiting only and are not necessarily drawn to scale.

FIG. 1 illustrates block diagrams of example, non-limiting quantum chip structures 100 in accordance with one or more embodiments described herein. As shown, FIG. 1 depicts a first quantum chip structure 102 and a second quantum chip structure 104. In various aspects, the first quantum chip structure 102 can exhibit a spatially-nonuniform and/or a spatially-uneven chip gap, and the second quantum chip structure 104 can exhibit a spatially-uniform and/or a spatially-even chip gap.

In various embodiments, the first quantum chip structure 102 can comprise a qubit chip 106 and an interposer chip 108. In various aspects, the qubit chip 106 can be any suitable quantum substrate (e.g., silicon) on which can be fabricated one or more qubit devices such as Josephson junctions (not shown). In various aspects, the interposer chip 108 can be any suitable quantum substrate (e.g., silicon) on which can be fabricated one or more integrated circuit elements such as capacitors, inductors, waveguides, and/or resonators (not shown). In various instances, the qubit chip 106 can be coupled to the interposer chip 108 by the one or more solder interconnects 110. In various aspects, the one or more solder interconnects 110 can be solder bumps formed from any suitable solder material. In various aspects, the one or more solder interconnects 110 can be formed on one or more under bump metallizations 114 of the interposer chip 108. As shown, the one or more solder interconnects 110 can couple the one or more under bump metallizations 114 to one or more corresponding under bump metallizations 112 of the qubit chip 106. In various aspects, the one or more under bump metallizations 112 and/or the one or more under bump metallizations 114 can be composed of any suitable under bump metallization materials (e.g., the one or more under bump metallizations 112 can be composed of the same under bump metallization materials and/or different under bump metallization materials as the one or more under bump metallizations 114). In some cases, the compositions of the one or more under bump metallizations 112 and/or the one or more under bump metallizations 114 can be chosen and/or selected so as to prevent under bump metallization consumption and/or to promote low loss electrical connections.

In various embodiments, as shown, the qubit chip 106 and the interposer chip 108 of the first quantum chip structure 102 can have a nonuniform and/or uneven gap. Specifically, as shown, the qubit chip 106 is slanted and/or tilted as compared to the interposer chip 108, such that a right-side gap 116 between the qubit chip 106 and the interposer chip 108 is different from (e.g., larger than) a left-side gap 118 between the qubit chip 106 and the interposer chip 108. In other words, the plane of the qubit chip 106 can be not parallel to the plane of the interposer chip 108. As mentioned above, such a nonuniform and/or uneven gap can be caused by improper bonding of the qubit chip 106 to the interposer chip 108 (e.g., it can be difficult to maintain a spatially-uniform gap during cold welding and/or low temperature reflow soldering) and/or by solder creep over time (e.g., the one or more solder interconnects 110 can experience non-uniform and/or uneven creep over time, which can cause one part of the qubit chip 106 to become closer to the interposer chip 108 than another part of the qubit chip 106). In various aspects, such a nonuniform and/or uneven gap can negatively affect the performance of qubit devices on the qubit chip 106.

In various embodiments, as shown, the second quantum chip structure 104 can comprise the qubit chip 106 and the interposer chip 108. Just as above, the qubit chip 106 can be coupled to the interposer chip 108 by the one or more solder interconnects 110. Moreover, the one or more solder interconnects 110 can couple the one or more under bump metallizations 114 of the interposer chip 108 to the one or more under bump metallizations 112 of the qubit chip 106.

In various embodiments, the second quantum chip structure 104 can comprise one or more injection-molded solder pillars 120. In various aspects, the one or more injection-molded solder pillars 120 can comprise tertiary (e.g., three-component), quaternary (e.g., four-component), and/or quinary (e.g., five-component) tin alloys that are able to be implemented with any suitable injection-molded soldering techniques. In various aspects, such tertiary, quaternary, and/or quinary tin alloys can exhibit high yield strengths (e.g., between 3,000 psi and 15,000 psi, inclusively), can exhibit melting temperatures that are above the melting temperatures of the one or more solder interconnects 110, can exhibit superconducting characteristics, and/or can be applied through injection-molded soldering. In some cases, such properties can be exhibited by some binary tin alloys (e.g., such as tin and lead (Pb), tin and silver, and/or tin and copper). In various aspects, Table 1, shown below, lists some exemplary, non-limiting tin alloys that can be implemented to form the one or more injection-molded solder pillars 120, along with their approximate yield strengths.

TABLE 1

| Alloy Composition | Yield Strength (psi) |
| --- | --- |
| Sn—2Ag—9.8Bi—9.8In | 14,560 |
| Sn—2Ag—7.5Bi—0.5Cu | 12,370 |
| Sn—2.5Ag—19.5Bi | 12,070 |
| Sn—3Ag—54Bi—2Cu—2Sb | 11,440 |
| Sn—31.5Bi—3Zn | 10,500 |
| Sn—3Ag—54Bi—2In—2Sb | 5,055 |
| Sn—3.5Ag—1.5In | 4,616 |
| Sn—37Pb | 3,950 |
| Sn—0.2Ag—2Cu—0.8Sb | 3,758 |
| Sn—0.5Ag—4Cu | 3,724 |

In various aspects, the one or more injection-molded solder pillars 120 can be formed on one or more under bump metallizations 122 of the interposer chip 108. In various aspects, the one or more under bump metallizations 122 can be composed of any suitable under bump metallization materials (e.g., the one or more under bump metallizations 122 can be composed of the same under bump metallization materials and/or different under bump metallization materials as the one or more under bump metallizations 112 and/or the one or more under bump metallizations 114). In some cases, the compositions of the one or more under bump metallizations 122 can be chosen and/or selected so as to prevent under bump metallization consumption and/or to promote low loss electrical connections.

In various aspects, the one or more injection-molded solder pillars 120 can be formed into any suitable geometry. That is, in various aspects, the one or more injection-molded solder pillars 120 can exhibit any suitable cross-sectional shape (e.g., circular, rectangular, triangular, polygonal, elliptical, concave, convex, and/or arbitrary/irregular) and/or can exhibit any suitable dimensions (e.g., 10 microns in height to 100 microns in height; hundreds to thousands of microns in lateral directions). In various aspects, each of the one or more injection-molded solder pillars 120 can have a different cross-sectional area and/or cross-sectional shape and/or lateral dimensions. In various aspects, all of the one or more injection-molded solder pillars 120 can have a same height (e.g., in various cases, height can be considered as the direction that is perpendicular to the plane of the interposer chip 108). In some cases, however, the one or more injection-molded solder pillars 120 can have different heights (e.g., such as when the qubit chip 106 has differently elevated surfaces that require structural support).

As shown, in various embodiments, the qubit chip 106 can rest upon and/or make contact with the one or more injection-molded solder pillars 120. In various aspects, this can cause a spatially-uniform and/or spatially-even gap 124 to be maintained between the qubit chip 106 and the interposer chip 108. As mentioned above, the right-side gap 116 can be unequal to the left-side gap 118 of the first quantum chip structure 102 because of a bonding procedure used to couple the qubit chip 106 to the interposer chip 108 (e.g., uneven pressing during cold welding and/or low temperature reflow soldering can cause an uneven and/or nonuniform gap), and/or because of creep experienced by the one or more solder interconnects 110 over time. In various aspects, the one or more injection-molded solder pillars 120 can ameliorate such problems. Specifically, the one or more injection-molded solder pillars 120 can act as backstops during cold welding and/or low temperature reflow soldering, which backstops can prevent any portion of the qubit chip 106 from being pressed closer to the interposer chip 108 than desired (e.g., the one or more injection-molded solder pillars 120 can have a sufficiently high yield strength such that no portion of the qubit chip 106 can move past and/or plastically deform the one or more injection-molded solder pillars 120; the result can be that every portion of the qubit chip 106 is forced to sit at a desired and/or uniform distance away from the interposer chip 108). Moreover, in various instances, the one or more injection-molded solder pillars 120 can be less vulnerable to creep than the one or more solder interconnects 110 (e.g., since the one or more injection-molded solder pillars 120 can have a sufficiently high yield strength, they can avoid experiencing significant creep over time; thus, even if the one or more solder interconnects 110 experience significant levels of creep, the qubit chip 106 can be resting on the one or more injection-molded solder pillars 120 and thus cannot move closer to the interposer chip 108). In various cases, as shown, the magnitude of the spatially-uniform and/or spatially-even gap 124 can be equal to and/or substantially equal to the sum of the height of the one or more injection-molded solder pillars 120 and the height of the one or more under bump metallizations 122. However, in various aspects, the height of the one or more under bump metallizations 122 can be so small as to be considered negligible. In such case, the magnitude of the spatially-uniform and/or spatially-even gap 124 can be said to be substantially equal to the height of the one or more injection-molded solder pillars 120.

In various aspects, as shown, the one or more injection-molded solder pillars 120 can be arranged in parallel with the one or more solder interconnects 110. That is, in various instances, the one or more injection-molded solder pillars 120 can each make contact with the interposer chip 108 (e.g., with a corresponding one of the one or more under bump metallizations 122) and with the qubit chip 106, and the one or more solder interconnects 110 can each make contact with the interposer chip 108 (e.g., with a corresponding one of the one or more under bump metallizations 114) and with the qubit chip 106 (e.g., with a corresponding one of the one or more under bump metallizations 112). In other words, the one or more injection-molded solder pillars 120 can be positioned at one or more locations on the interposer chip 108 and the one or more solder interconnects 110 can be positioned at one or more different locations on the interposer chip 108, such that the one or more injection-molded solder pillars 120 are not in a same location and/or a same solder joint as the one or more solder interconnects 110.

FIG. 2 illustrates a flow diagram of an example, non-limiting method 200 that can facilitate uniform qubit chip gaps via injection-molded solder pillars in accordance with one or more embodiments described herein. In various aspects, the method 200 can be implemented to fabricate the second quantum chip structure 104.

In various embodiments, act 202 can include forming, by injection molded soldering, one or more solder bumps (e.g., 110) on an interposer chip (e.g., 108) at one or more first positions on the interposer chip (e.g., forming the one or more solder bumps on one or more first under bump metallizations (e.g., 114) of the interposer chip).

In various aspects, act 204 can include forming, by injection molded soldering, one or more solder backstops (e.g., 120) on the interposer chip at one or more second locations on the interposer chip (e.g., forming the one or more solder backstops on one or more second under bump metallizations (e.g., 122) on the interposer chip).

In various instances, act 206 can include bonding the qubit chip to the interposer chip (e.g., such as via cold welding and/or low temperature reflow soldering) by mechanically pressing the qubit chip onto the one or more solder bumps. In various aspects, the qubit chip can land on the one or more solder backstops such that there is a uniform gap between the qubit chip and the interposer chip. In various cases, the one or more solder bumps can deform during the pressing, which can thereby allow the qubit chip to move closer to the interposer chip. In various instances, once the qubit chip lands on the one or more solder backstops, the one or more solder backstops can serve as standoffs and/or barriers past which the qubit chip cannot move. Thus, the one or more solder backstops can prevent further and/or uneven deformation of the one or more solder bumps. In various cases, if the one or more solder bumps are prevented from deforming nonuniformly and/or unevenly, then the gap between the qubit chip and the interposer chip can likewise be prevented from becoming nonuniform and/or uneven.

In various cases, although method 200 discusses pressing the qubit chip toward the interposer chip, this is exemplary and non-limiting. In various aspects, the interposer chip can be pressed toward the qubit chip. In various aspects, the qubit chip and the interposer chip can be pressed simultaneously toward each other.

In various aspects, although method 200 lists the formation of the one or more solder bumps before the formation of the one or more solder backstops, this is exemplary and non-limiting. In various instances, the formation of the one or more solder backstops can occur before the formation of the one or more solder bumps.

FIGS. 3-13 collectively illustrate an exemplary, non-limiting fabrication process that can be implemented to create uniform chip gaps via injection-molded solder pillars in accordance with various embodiments described herein.

Figure 3:
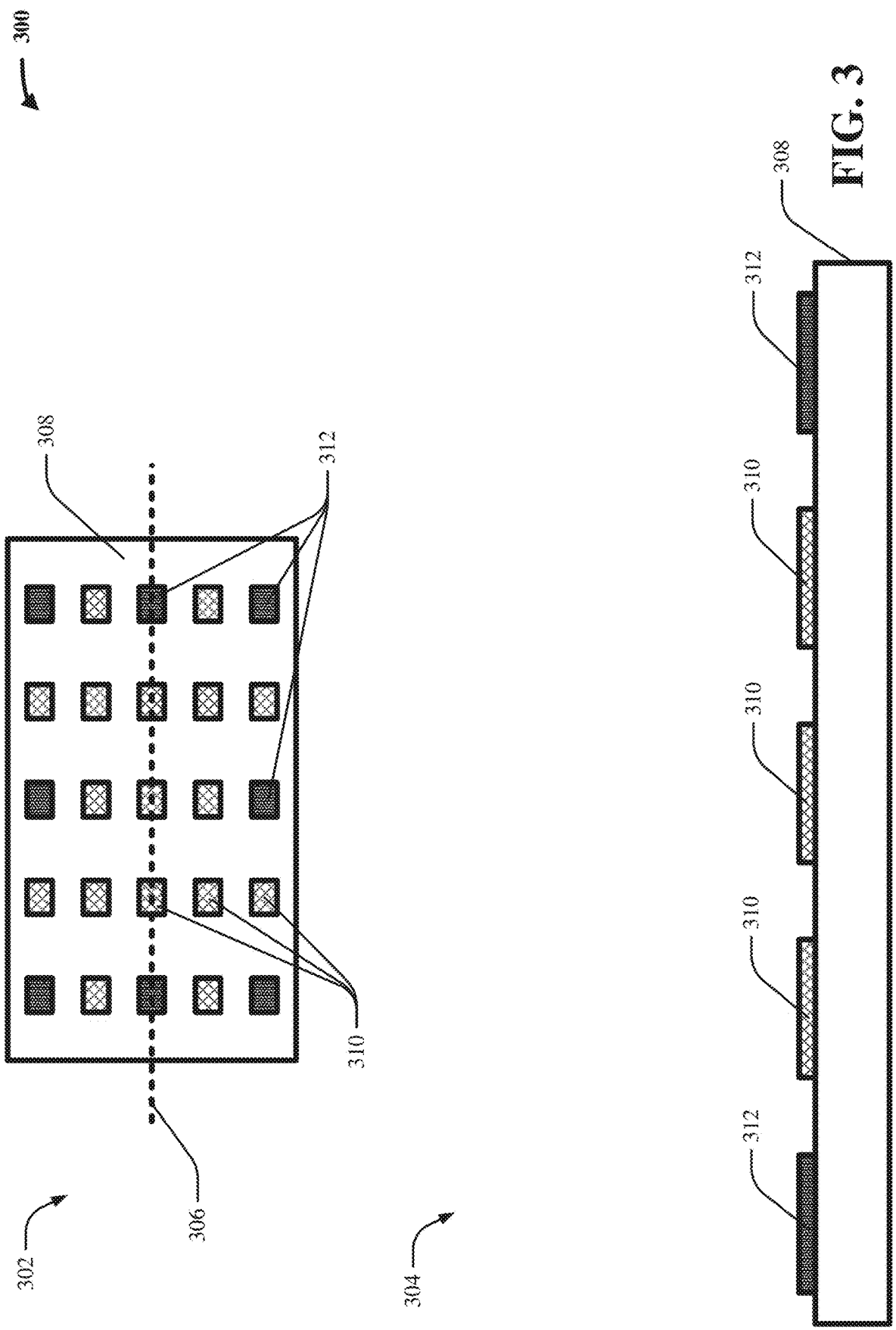

FIG. 3 illustrates a block diagram of an example, non-limiting intermediate substrate structure 300 in accordance with one or more embodiments described herein. In various aspects, FIG. 3 can depict the intermediate substrate structure 300 during an integration and/or fabrication sequence for the manufacture of a qubit chip flip-chip bonded to an interposer chip.

As shown, FIG. 3 depicts the intermediate substrate structure 300 from an aerial view 302 and from a cross-sectional view 304. In various aspects, the cross-sectional view 304 can be taken along the axis 306.

In various embodiments, the intermediate substrate structure 300 can comprise an interposer 308. In various aspects, the interposer 308 can be any suitable substrate for use in quantum computing systems (e.g., a silicon substrate). In various aspects, one or more integrated circuit elements (e.g., capacitors, inductors, resonators, waveguides) can be fabricated on the interposer 308 (not shown). Although FIG. 3 depicts the interposer 308 as having a rectangular shape, it should be appreciated that this is non-limiting and for illustration only. In various aspects, the interposer 308 can have any suitable shape, size, and/or dimensions.

In various instances, one or more under bump metallizations 310 and one or more under bump metallizations 312 can be formed on the interposer 308. In various aspects, the one or more under bump metallizations 310 can be any suitable patterned, thin-film stack of material that provides an electrical connection to the interposer 308. In various instances, the one or more under bump metallizations 310 can have any suitable shapes, sizes, and/or dimensions, and can be composed of any suitable under bump metallization materials (e.g., indium and/or gold). In various aspects, the one or more under bump metallization 310 can be arranged on the interposer 308 in any suitable fashion, shape, and/or pattern. As shown in the aerial view 302, seventeen of the one or more under bump metallizations 310 are depicted in FIG. 3, but this is exemplary and non-limiting. In various aspects, any suitable number of the one or more under bump metallizations 310 can be implemented. Similarly, in various cases, the one or more under bump metallizations 312 can be any suitable patterned, thin-film stack of material that provides an electrical connection to the interposer 308. In various instances, the one or more under bump metallizations 312 can have any suitable shapes, sizes, and/or dimensions, and can be composed of any suitable under bump metallization materials (e.g., indium and/or gold). In various aspects, the one or more under bump metallization 312 can be arranged on the interposer 308 in any suitable fashion, shape, and/or pattern (e.g., as shown, the one or more under bump metallizations 312 are arranged at intervals along the periphery and/or perimeter of the interposer 308). As shown in the aerial view 302, eight of the one or more under bump metallizations 312 are depicted in FIG. 3, but this is exemplary and non-limiting. In various aspects, any suitable number of the one or more under bump metallizations 312 can be implemented.

In various cases, the one or more under bump metallizations 310 can be composed of the same materials and/or of different materials as the one or more under bump metallizations 312. In various aspects, the compositions of the one or more under bump metallizations 310 can depend upon the compositions of the solder materials that are going to be fabricated on the one or more under bump metallizations 310 (e.g., to prevent under bump metallization consumption and/or to facilitate low loss connections). Similarly, in various aspects, the compositions of the one or more under bump metallizations 312 can depend upon the compositions of the solder materials that are going to be fabricated on the one or more under bump metallizations 312 (e.g., to prevent under bump metallization consumption and/or to facilitate low loss connections). As shown in the following figures, the one or more under bump metallizations 310 can be later covered by one or more injection-molded solder interconnects, and the one or more under bump metallizations 312 can be later covered by one or more injection-molded solder pillars.

Although FIG. 3 depicts the one or more under bump metallizations 310 as having the same shapes, sizes, and/or dimensions as the one or more under bump metallizations 312, this is exemplary and non-limiting. In various aspects, the one or more under bump metallizations 310 can have different shapes, sizes, and/or dimensions than the one or more under bump metallizations 312.

FIG. 4 illustrates a block diagram of an example, non-limiting intermediate substrate structure 400 including a first resist layer in accordance with one or more embodiments described herein. In various aspects, FIG. 4 can depict the intermediate substrate structure 400 during an integration and/or fabrication sequence for the manufacture of a qubit chip flip-chip bonded to an interposer chip. In various instances, the intermediate substrate structure 400 can be considered as the result obtained by forming a photoresist layer on the intermediate substrate structure 300.

As shown, FIG. 4 depicts the intermediate substrate structure 400 from an aerial view 402 and from a cross-sectional view 404. In various aspects, the cross-sectional view 404 can be taken along the axis 406.

In various embodiments, the intermediate substrate structure 400 can comprise the interposer 308, the one or more under bump metallizations 310, and the one or more under bump metallizations 312. In various aspects, the intermediate substrate structure 400 can include a resist layer 408. In various instances, the resist layer 408 can be a methyl methacrylate (MMA) layer and/or a poly methyl methacrylate (PMMA) layer and/or any other suitable photoresist layer that is spun, baked, and/or developed onto the interposer 308. In various aspects, the resist layer 408 can have any suitable sizes, shapes, and/or dimensions. In various aspects, the resist layer 408 can be a thin resist layer of 50 microns thickness and/or less. In various aspects, the resist layer 408 can have a thickness in the range of 10 microns to 100 microns. In some cases, the resist layer 408 can have a thickness of 60 microns. In various aspects, the thickness of the resist layer 408 can define the height of the one or more injection-molded solder pillars to be formed on the one or more under bump metallizations 312.

FIG. 5 illustrates a block diagram of an example, non-limiting intermediate substrate structure 500 where the first resist layer is patterned to form injection-molded solder pillars in accordance with one or more embodiments described herein. In various aspects, FIG. 5 can depict the intermediate substrate structure 500 during an integration and/or fabrication sequence for the manufacture of a qubit chip flip-chip bonded to an interposer chip. In various instances, the intermediate substrate structure 500 can be considered as the result obtained by patterning the resist layer 408 of the intermediate substrate structure 400.

As shown, FIG. 5 depicts the intermediate substrate structure 500 from an aerial view 502 and from a cross-sectional view 504. In various aspects, the cross-sectional view 504 can be taken along the axis 506.

In various embodiments, the intermediate substrate structure 500 can comprise the interposer 308, the one or more under bump metallizations 310, the one or more under bump metallizations 312, and the resist layer 408. In various aspects, the intermediate substrate structure 500 can include one or more trenches 508. In various aspects, the one or more trenches 508 can correspond to and/or be patterned over the one or more under bump metallizations 312. In various cases, the one or more trenches 508 can be formed via any suitable lithography technique (e.g., electron beam lithography and/or optical lithography). In various aspects, the one or more trenches 508 can have any suitable sizes, shapes, and/or dimensions. In various cases, the shapes and/or cross-sectional dimensions of the one or more trenches 508 can correspond to and/or match the shapes and/or cross-sectional dimensions of the one or more under bump metallizations 312. In various aspects, the one or more injection-molded solder pillars will be formed within the one or more trenches 508.

FIG. 6 illustrates a block diagram of an example, non-limiting intermediate substrate structure 600 including injection-molded solder pillars in accordance with one or more embodiments described herein. In various aspects, FIG. 6 can depict the intermediate substrate structure 600 during an integration and/or fabrication sequence for the manufacture of a qubit chip flip-chip bonded to an interposer chip. In various instances, the intermediate substrate structure 600 can be considered as the result obtained by filling the one or more trenches 508 of the intermediate substrate structure 500.

As shown, FIG. 6 depicts the intermediate substrate structure 600 from an aerial view 602 and from a cross-sectional view 604. In various aspects, the cross-sectional view 604 can be taken along the axis 606.

In various embodiments, the intermediate substrate structure 600 can comprise the interposer 308, the one or more under bump metallizations 310, the one or more under bump metallizations 312, the resist layer 408, and the one or more trenches 508. In various aspects, the intermediate substrate structure 600 can include one or more injection-molded solder pillars 608. In various aspects, any suitable injection-molded soldering technique can be implemented to form the one or more injection-molded solder pillars 608 in the one or more trenches 508 and on top of the one or more under bump metallizations 312. In various aspects, the one or more injection-molded solder pillars 608 can comprise tertiary, quaternary, and/or quinary tin alloys, as described above in connection with Table 1. Thus, the one or more injection-molded solder pillars 608 can exhibit high yield strengths and high melting temperatures, as well as superconductivity. In various aspects, it should be appreciated that the sizes, shapes, and/or dimensions of the one or more injection-molded solder pillars 608 can correspond to and/or match the sizes, shapes, and/or dimensions of the one or more trenches 508. Thus, controlling the sizes, shapes, and/or dimensions of the one or more trenches 508 can correspondingly control the sizes, shapes, and/or dimensions of the one or more injection-molded solder pillars 608. In various instances, the one or more injection-molded solder pillars 608 can facilitate uniform and/or desired chip gaps, as explained herein.

Figure 7:
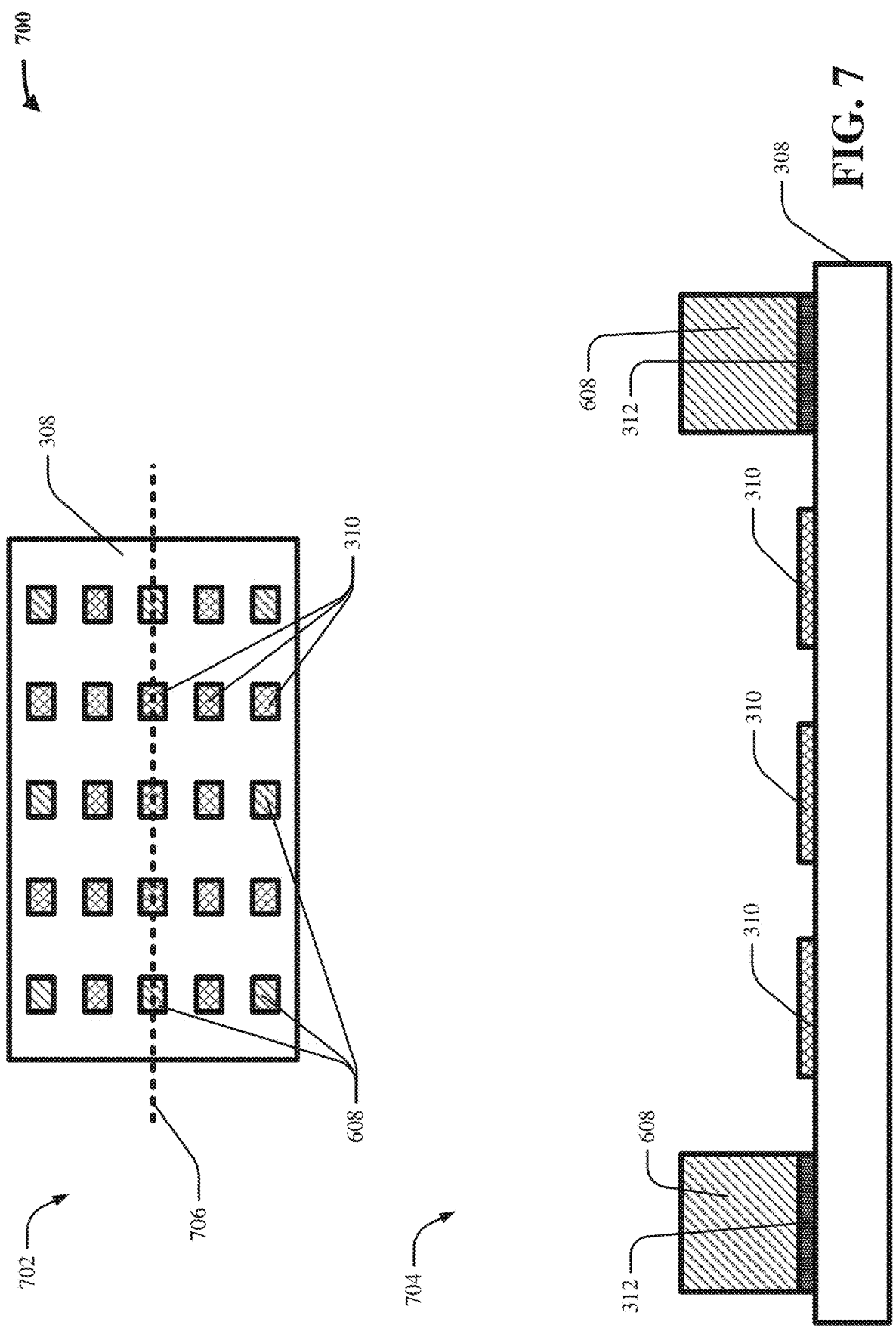

FIG. 7 illustrates a block diagram of an example, non-limiting intermediate substrate structure 700 where the first resist layer is stripped in accordance with one or more embodiments described herein. In various aspects, FIG. 7 can depict the intermediate substrate structure 700 during an integration and/or fabrication sequence for the manufacture of a qubit chip flip-chip bonded to an interposer chip. In various instances, the intermediate substrate structure 700 can be considered as the result obtained by stripping the resist layer 408 of the intermediate substrate structure 600.

As shown, FIG. 7 depicts the intermediate substrate structure 700 from an aerial view 702 and from a cross-sectional view 704. In various aspects, the cross-sectional view 704 can be taken along the axis 706.

In various embodiments, the intermediate substrate structure 700 can comprise the interposer 308, the one or more under bump metallizations 310, the one or more under bump metallizations 312, and the one or more injection-molded solder pillars 608. In various aspects, as shown, the intermediate substrate structure 700 can lack the resist layer 408. In various cases, any suitable stripping, lift-off, and/or etching technique can be implemented to remove the resist layer 408.

FIG. 8 illustrates a block diagram of an example, non-limiting intermediate substrate structure 800 including a second resist layer in accordance with one or more embodiments described herein. In various aspects, FIG. 8 can depict the intermediate substrate structure 800 during an integration and/or fabrication sequence for the manufacture of a qubit chip flip-chip bonded to an interposer chip. In various instances, the intermediate substrate structure 800 can be considered as the result obtained by forming a photoresist layer on the intermediate substrate structure 700.

As shown, FIG. 8 depicts the intermediate substrate structure 800 from an aerial view 802 and from a cross-sectional view 804. In various aspects, the cross-sectional view 804 can be taken along the axis 806.

In various embodiments, the intermediate substrate structure 800 can comprise the interposer 308, the one or more under bump metallizations 310, the one or more under bump metallizations 312, and the one or more injection-molded solder pillars 608. In various aspects, the intermediate substrate structure 800 can include a resist layer 808. In various instances, the resist layer 808 can be a methyl methacrylate (MMA) layer and/or a poly methyl methacrylate (PMMA) layer and/or any other suitable photoresist layer that is spun, baked, and/or developed onto the interposer 308. In various aspects, the resist layer 808 can have any suitable sizes, shapes, and/or dimensions. In various aspects, the resist layer 808 can be a thick resist layer of over 100 microns in height. In various aspects, the thickness of the resist layer 808 can define the height of the one or more injection-molded solder interconnects to be formed on the one or more under bump metallizations 310.

As shown, in various aspects, the resist layer 808 can be patterned over the one or more injection-molded solder pillars 608. However, in some cases, this can be avoided, depending upon whether the resist topography is sufficiently flat.

Figure 9:
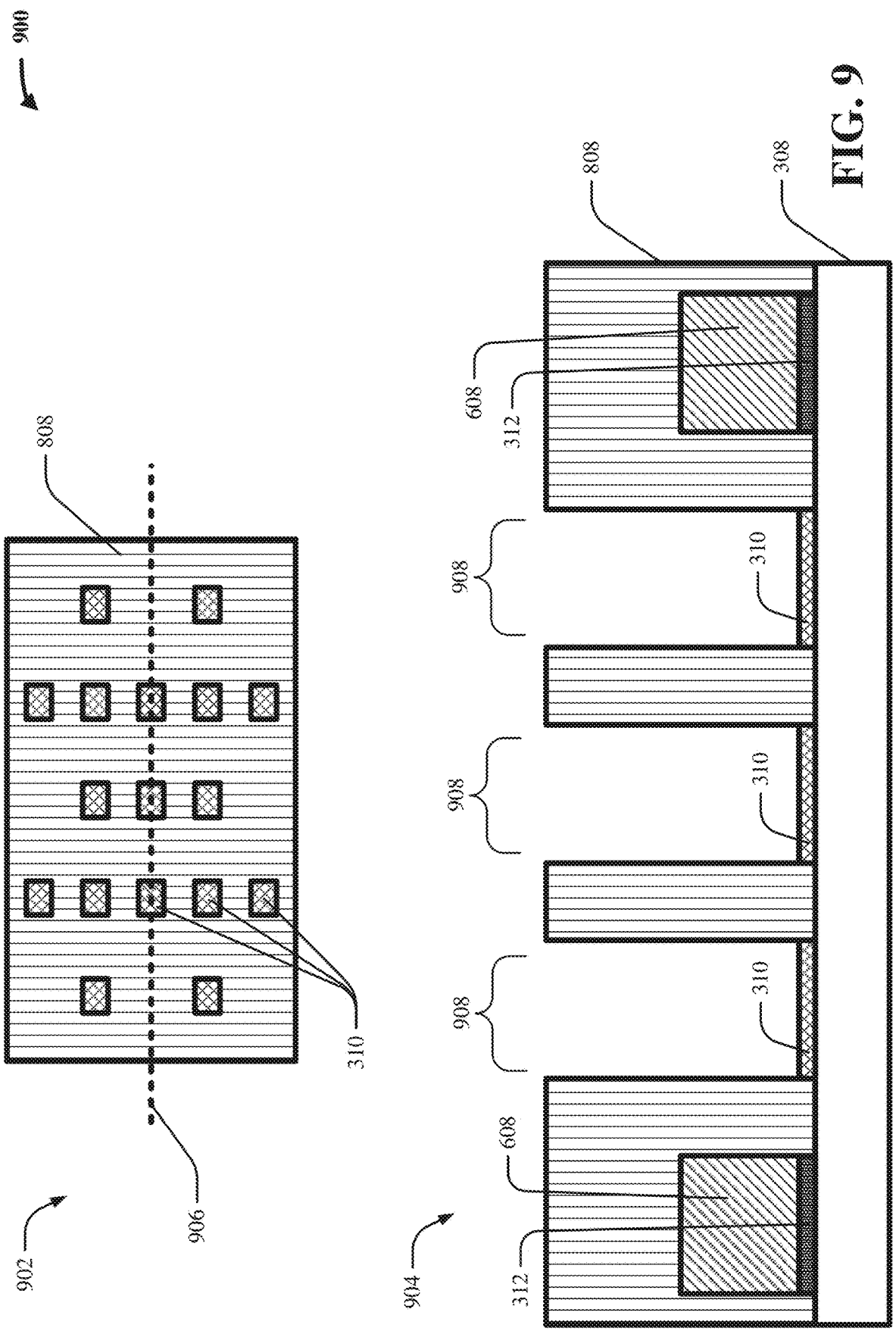

FIG. 9 illustrates a block diagram of an example, non-limiting intermediate substrate structure 900 wherein the second resist layer is patterned to form injection-molded solder interconnects in accordance with one or more embodiments described herein. In various aspects, FIG. 9 can depict the intermediate substrate structure 900 during an integration and/or fabrication sequence for the manufacture of a qubit chip flip-chip bonded to an interposer chip. In various instances, the intermediate substrate structure 900 can be considered as the result obtained by patterning the resist layer 808 of the intermediate substrate structure 800.

As shown, FIG. 9 depicts the intermediate substrate structure 900 from an aerial view 902 and from a cross-sectional view 904. In various aspects, the cross-sectional view 904 can be taken along the axis 906.

In various embodiments, the intermediate substrate structure 900 can comprise the interposer 308, the one or more under bump metallizations 310, the one or more under bump metallizations 312, the one or more injection-molded solder pillars 608, and the resist layer 808. In various aspects, the intermediate substrate structure 900 can include one or more trenches 908. In various aspects, the one or more trenches 908 can correspond to and/or be patterned over the one or more under bump metallizations 310. In various cases, the one or more trenches 908 can be formed via any suitable lithography technique (e.g., electron beam lithography and/or optical lithography). In various aspects, the one or more trenches 908 can have any suitable sizes, shapes, and/or dimensions. In various cases, the shapes and/or cross-sectional dimensions of the one or more trenches 908 can correspond to and/or match the shapes and/or cross-sectional dimensions of the one or more under bump metallizations 310. In various aspects, the one or more injection-molded solder interconnects will be formed within the one or more trenches 908.

Figure 10:
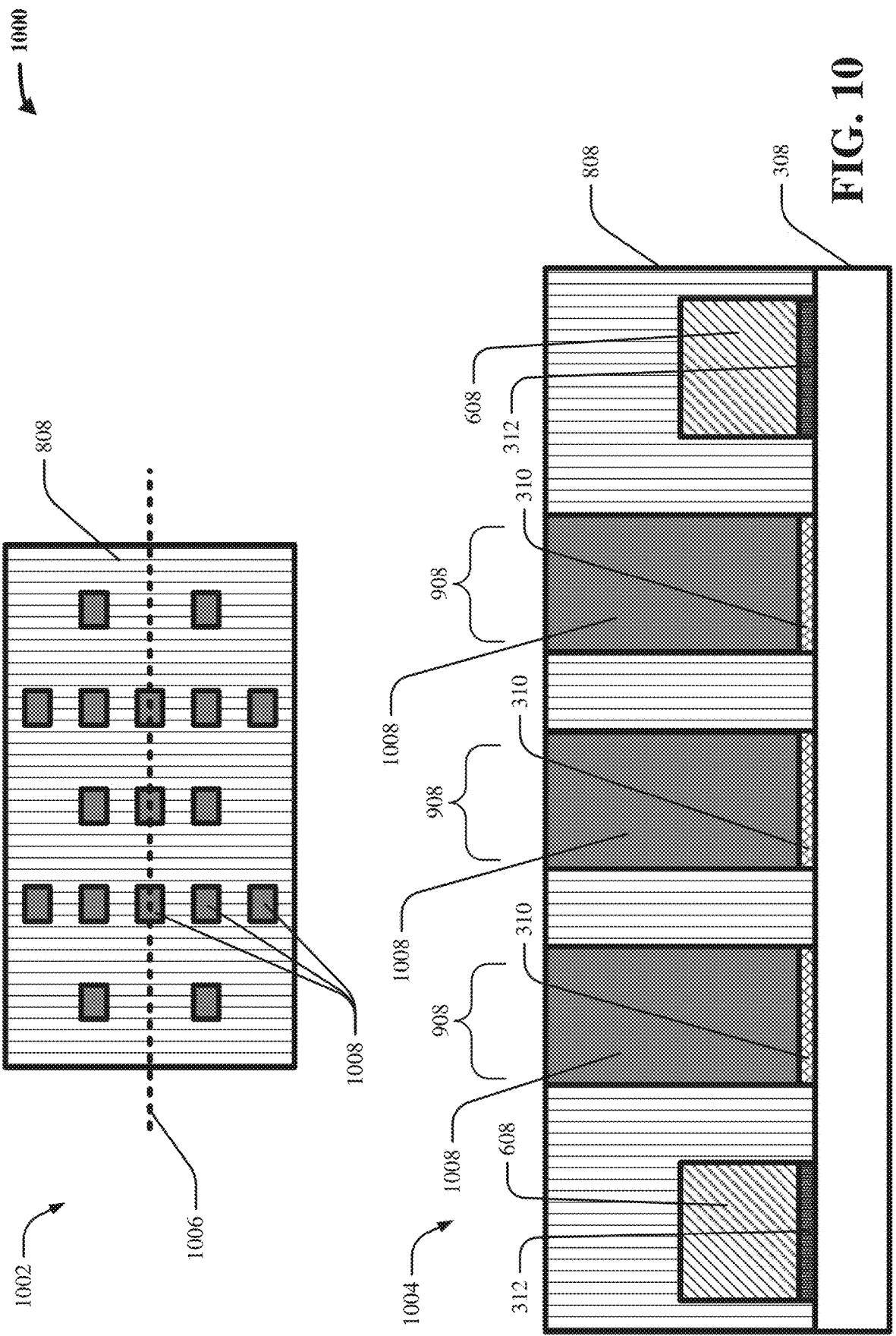

FIG. 10 illustrates a block diagram of an example, non-limiting intermediate substrate structure 1000 including injection-molded solder interconnects in accordance with one or more embodiments described herein. In various aspects, FIG. 10 can depict the intermediate substrate structure 1000 during an integration and/or fabrication sequence for the manufacture of a qubit chip flip-chip bonded to an interposer chip. In various instances, the intermediate substrate structure 1000 can be considered as the result obtained by filling the one or more trenches 908 of the intermediate substrate structure 900.

As shown, FIG. 10 depicts the intermediate substrate structure 1000 from an aerial view 1002 and from a cross-sectional view 1004. In various aspects, the cross-sectional view 1004 can be taken along the axis 1006.

In various embodiments, the intermediate substrate structure 1000 can comprise the interposer 308, the one or more under bump metallizations 310, the one or more under bump metallizations 312, the resist layer 808, and the one or more trenches 908. In various aspects, the intermediate substrate structure 1000 can include one or more injection-molded solder interconnects 1008. In various aspects, any suitable injection-molded soldering technique can be implemented to form the one or more injection-molded solder interconnects 1008 in the one or more trenches 908 and on top of the one or more under bump metallizations 310. In various aspects, the one or more injection-molded solder interconnects 1008 can comprise any suitable cold weldable soldering material (e.g., indium) and/or any suitable low temperature reflow soldering material. In various aspects, the one or more injection-molded solder interconnects 1008 can exhibit low yield strengths and low melting temperatures, as well as superconductivity. In various aspects, it should be appreciated that the sizes, shapes, and/or dimensions of the one or more injection-molded solder interconnects 1008 can correspond to and/or match the sizes, shapes, and/or dimensions of the one or more trenches 908. Thus, controlling the sizes, shapes, and/or dimensions of the one or more trenches 908 can correspondingly control the sizes, shapes, and/or dimensions of the one or more injection-molded solder interconnects 1008.

Figure 11:
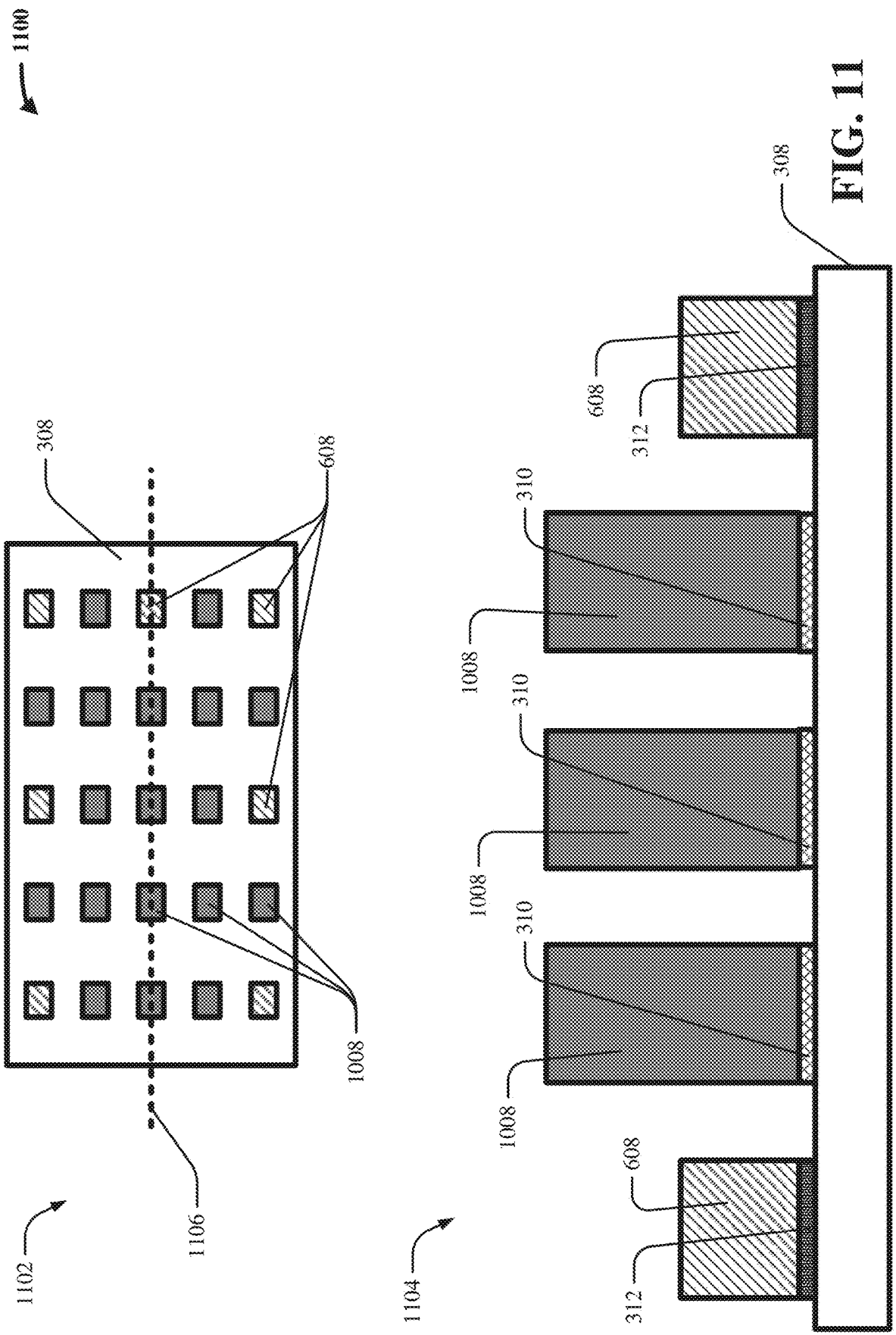

FIG. 11 illustrates a block diagram of an example, non-limiting intermediate substrate structure 1100 where the second resist layer is stripped in accordance with one or more embodiments described herein. In various aspects, FIG. 11 can depict the intermediate substrate structure 1100 during an integration and/or fabrication sequence for the manufacture of a qubit chip flip-chip bonded to an interposer chip. In various instances, the intermediate substrate structure 1100 can be considered as the result obtained by stripping the resist layer 808 of the intermediate substrate structure 1000.

As shown, FIG. 11 depicts the intermediate substrate structure 1100 from an aerial view 1102 and from a cross-sectional view 1104. In various aspects, the cross-sectional view 1104 can be taken along the axis 1106.

In various embodiments, the intermediate substrate structure 1100 can comprise the interposer 308, the one or more under bump metallizations 310, the one or more under bump metallizations 312, the one or more injection-molded solder pillars 608, and the one or more injection-molded solder interconnects 1008. In various aspects, as shown, the intermediate substrate structure 1100 can lack the resist layer

808. In various cases, any suitable stripping, lift-off, and/or etching technique can be implemented to remove the resist layer 808.

Figure 12:
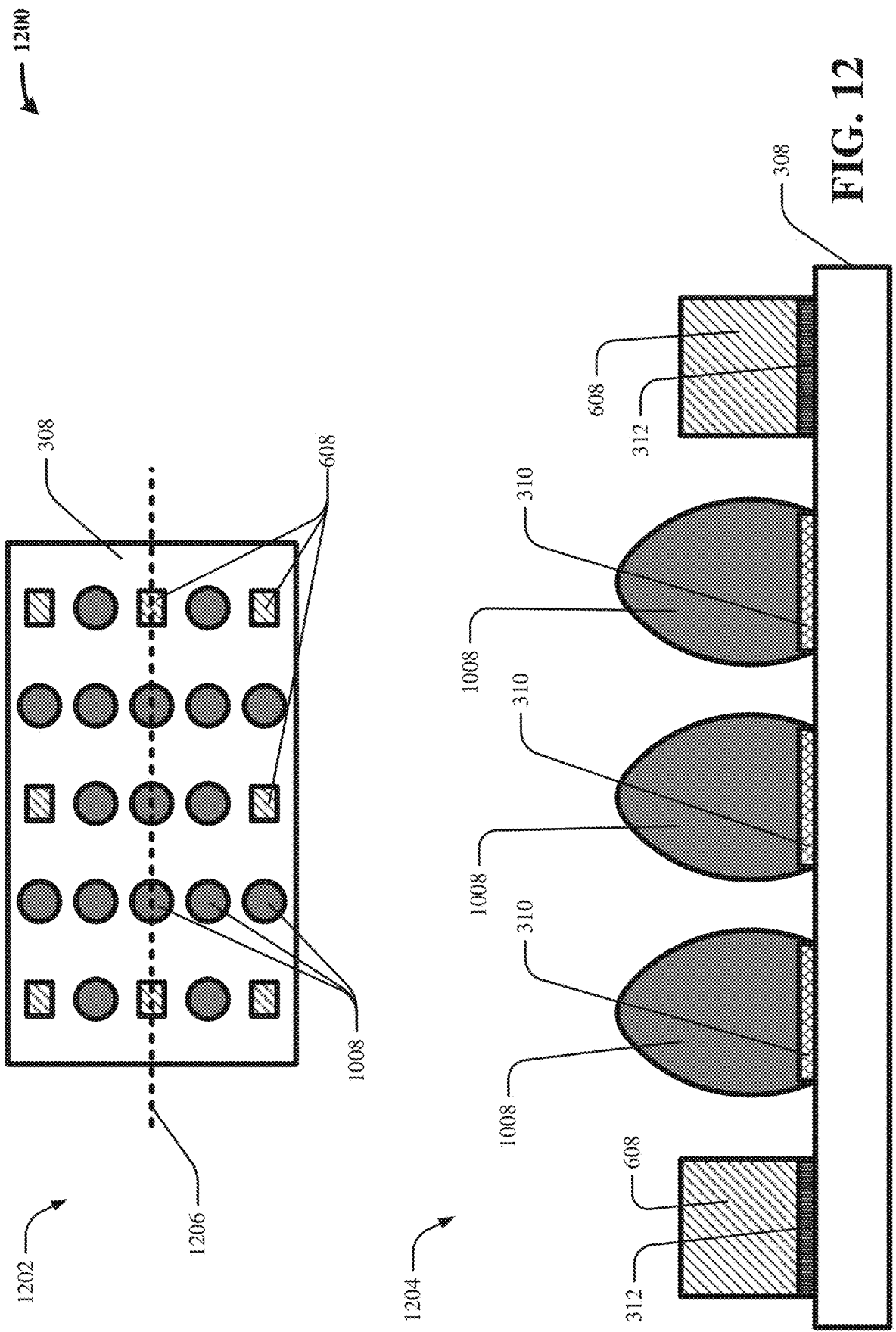

FIG. 12 illustrates a block diagram of an example, non-limiting intermediate substrate structure 1200 that has undergone a reflow process in accordance with one or more embodiments described herein. In various aspects, FIG. 12 can depict the intermediate substrate structure 1200 during an integration and/or fabrication sequence for the manufacture of a qubit chip flip-chip bonded to an interposer chip. In various instances, the intermediate substrate structure 1200 can be considered as the result obtained by applying a heating and/or reflow step to the intermediate substrate structure 1100.

As shown, FIG. 12 depicts the intermediate substrate structure 1200 from an aerial view 1202 and from a cross-sectional view 1204. In various aspects, the cross-sectional view 1204 can be taken along the axis 1206.

In various embodiments, the intermediate substrate structure 1200 can comprise the interposer 308, the one or more under bump metallizations 310, the one or more under bump metallizations 312, the one or more injection-molded solder pillars 608, and the one or more injection-molded solder interconnects 1008. In various aspects, as shown, the intermediate substrate structure 1100 can undergo a heating and/or reflow process. In various aspects, the heating and/or reflow process can be performed at a temperature that is above the melting temperature of the one or more injection-molded solder interconnects 1008 and that is below the melting temperature of the one or more injection-molded solder pillars 608. This can cause the one or more injection-molded solder interconnects 1008 to reflow (e.g., to melt and/or liquify so as to ball-up and/or become rounded in shape). Since the heating and/or reflow process is performed below the melting temperature of the one or more injection-molded solder pillars 608, the one or more injection-molded solder pillars 608 can avoid reflowing (e.g., can avoid melting and/or liquifying such that they do not ball-up and/or become rounded in shape). In various aspects, the shape of the one or more injection-molded solder pillars 608 can be considered as cookie-cutter (e.g., as unchanged from the shape that was patterned in the previous fabrication steps), while the shape of the one or more injection-molded solder interconnects 1008 can be considered as round-top after the heating and/or reflow process.

Figure 13:
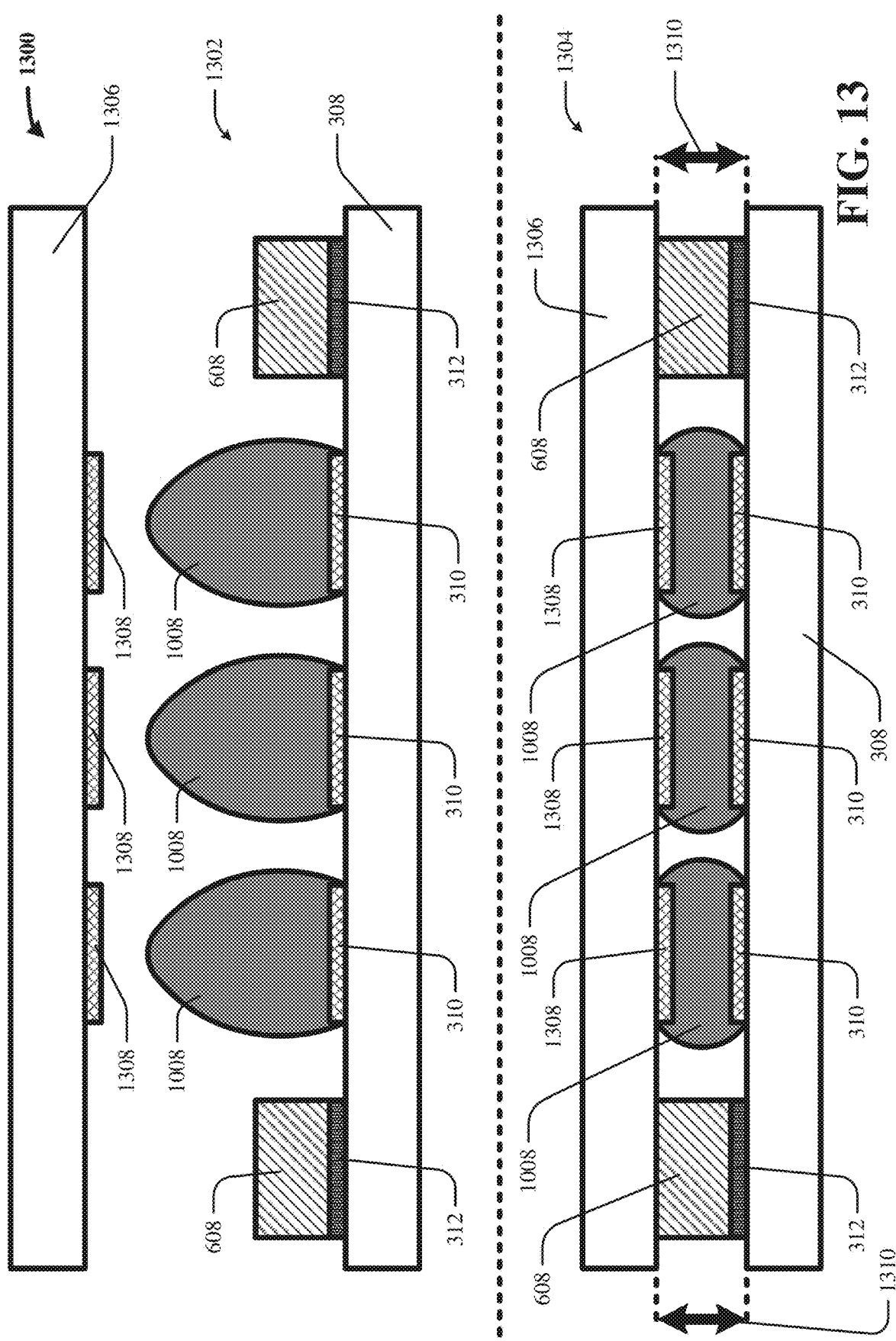

FIG. 13 illustrates block diagrams of example, non-limiting substrate structures 1300 that show how injection-molded solder pillars can facilitate and/or maintain uniform qubit chip gaps in accordance with one or more embodiments described herein. In various aspects, FIG. 13 can depict the intermediate substrate structures 1300 during an integration and/or fabrication sequence for the manufacture of a qubit chip flip-chip bonded to an interposer chip. In various instances, the intermediate substrate structures 1300 can be considered as the result obtained by bonding a qubit chip to the intermediate substrate structure 1200.

In various embodiments, the intermediate substrate structure 1302 can comprise the interposer 308, the one or more under bump metallizations 310, the one or more under bump metallizations 312, the one or more injection-molded solder pillars 608, and the one or more injection-molded solder interconnects 1008 after undergoing a heating and/or reflow process. In various aspects, as shown, the intermediate substrate structure 1302 can further comprise a quantum chip 1306. In various aspects, the quantum chip 1306 can be any suitable substrate for use in quantum computing systems (e.g., a silicon substrate). In various aspects, one or more qubit devices (e.g., Josephson junctions) can be fabricated on the quantum chip 1306 (not shown). Although FIG. 13 depicts the quantum chip 1306 as having a rectangular shape, it should be appreciated that this is non-limiting and for illustration only. In various aspects, the quantum chip 1306 can have any suitable shape, size, and/or dimensions.

In various instances, one or more under bump metallizations 1308 can be formed on the quantum chip 1306. In various aspects, the one or more under bump metallizations 1308 can be any suitable patterned, thin-film stack of material that provides an electrical connection to the quantum chip 1306. In various instances, the one or more under bump metallizations 1308 can have any suitable shapes, sizes, and/or dimensions, and can be composed of any suitable under bump metallization materials (e.g., indium and/or gold). In various aspects, the one or more under bump metallizations 1308 can be arranged on the quantum chip 1306 in any suitable fashion, shape, and/or pattern.

In various cases, the one or more under bump metallizations 1308 can be composed of the same materials and/or of different materials as the one or more under bump metallizations 312 and/or as the one or more under bump metallizations 310. In various aspects, the compositions of the one or more under bump metallizations 1308 can depend upon the compositions of the one or more injection-molded solder interconnects 1008 (e.g., to prevent under bump metallization consumption and/or to facilitate low loss connections).

In various aspects, the quantum chip 1306 can be bonded to the interposer 308 via cold welding and/or low temperature reflow soldering. In either case, the quantum chip 1306 can be pressed (e.g., and/or dragged via gravity) to toward the interposer 308, such that the one or more under bump metallizations 1308 contact the one or more injection-molded solder interconnects 1008. In various cases, since the one or more injection-molded solder interconnects have a low yield strength, the one or more injection-molded solder interconnects 1008 can deform during the pressing (e.g., the quantum chip 1306 can squash the one or more injection-molded solder interconnects 1008 as the quantum chip 1306 gets closer to the interposer 308).

In various embodiments, as shown by the intermediate substrate structure 1304, the quantum chip 1306 can, at some time during the pressing, land on and/or otherwise come into contact with the one or more injection-molded solder pillars 608. Since the one or more injection-molded solder pillars 608 have a high yield strength (e.g., between 3,000 psi and 15,000 psi, and/or greater in some cases), the quantum chip 1306 can fail to deform (e.g., can fail to plastically deform) the one or more injection-molded solder pillars 608 during the pressing. Thus, the quantum chip 1306 can be unable to move closer to the interposer 308 after having been pressed against the one or more injection-molded solder pillars 608. In various cases, the one or more injection-molded solder pillars 608 can be considered as high-modulus physical barriers that prevent further motion of the quantum chip 1306. Therefore, by landing on, resting on, and/or remaining on the one or more injection-molded solder pillars 608, the quantum chip 1306 can be kept at a desired, uniform distance 1310 away from the interposer 308. In various cases, the magnitude of the desired, uniform distance 1310 can be equal to the sum of the height of the one or more injection-molded solder pillars 608 and the height of the one or more under bump metallizations 312. In some cases, however, the height of the one or more under bump metallizations 312 can be so small as compared to the height of the one or more injection-molded solder pillars 608 as to be considered negligible. In such case, it can be said that the magnitude of the desired, uniform distance 1310 between the quantum chip 1306 and the interposer 308 is approximately equal to the height of the one or more injection-molded solder pillars 608.

As mentioned above, the one or more injection-molded solder pillars 608 (e.g., and thus the under bump metallizations 312) can be arranged on the interposer 308 so as to provide even and/or evenly spaced support for the quantum chip 1306 (e.g., the one or more injection-molded solder pillars 608 can be arranged so that all sides of the quantum chip 1306 are supported and/or resting on the one or more injection-molded solder pillars 608). Such even and/or evenly spaced support can help to ensure that all portions of the quantum chip 1306 are at an equal distance away from the surface of the interposer 308 (e.g., that distance being approximately equal to the height of the one or more injection-molded solder pillars 608).

As shown, the one or more injection-molded solder pillars 608 can facilitate and/or maintain the desired, uniform distance 1310 between the quantum chip 1306 and the interposer 308. Such a spatially-uniform and/or spatially-even gap can be facilitated in various embodiments without requiring seed layers. Moreover, since the one or more injection-molded solder pillars 608 are superconducting, they can avoid negatively impacting the coherences and/or capacitances of the qubit devices on the quantum chip 1306.

Figure 14:
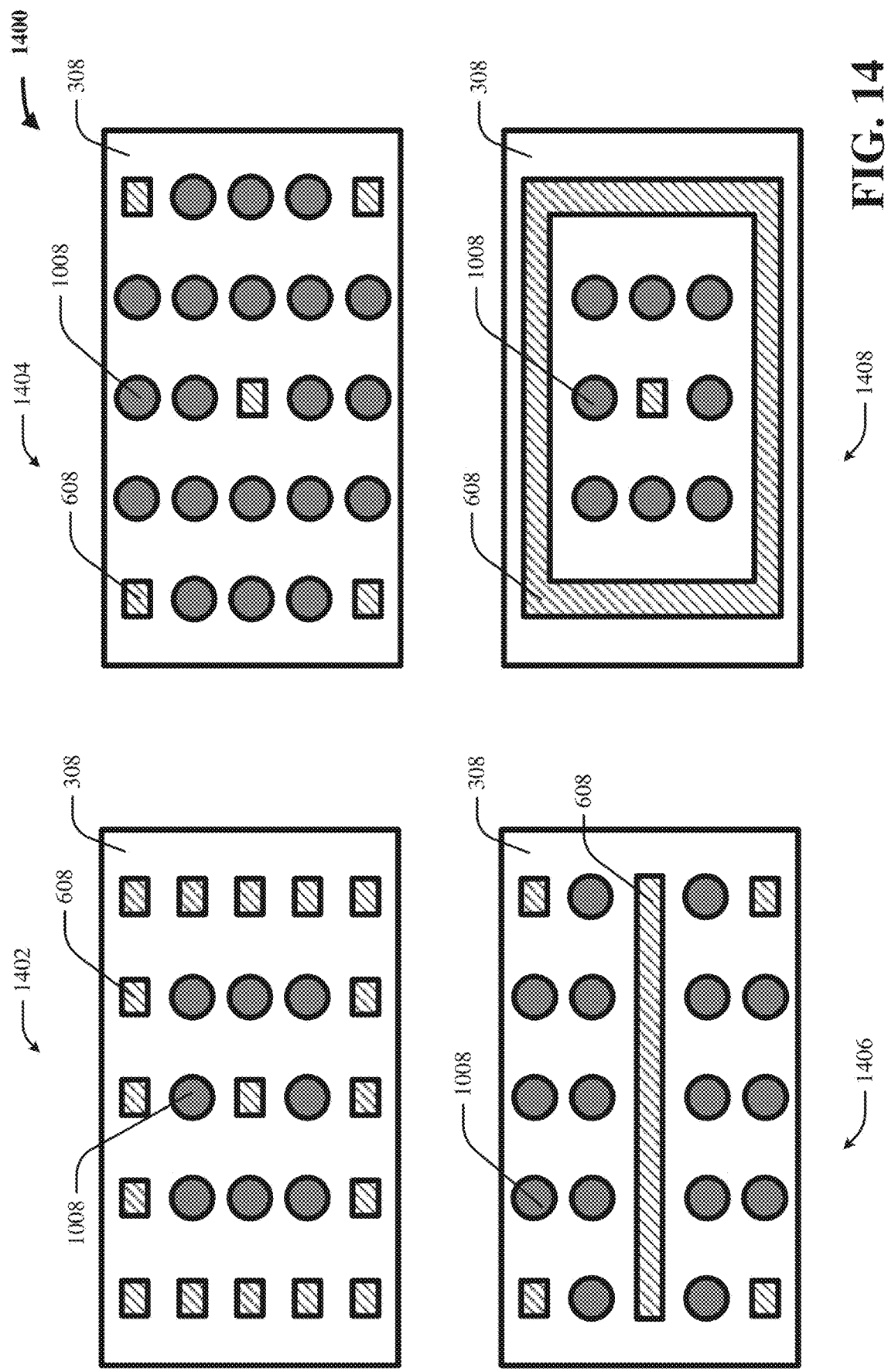
FIG. 14 illustrates block diagrams of example, non-limiting injection-molded solder pillar arrangements for facilitating uniform qubit chip gaps in accordance with one or more embodiments described herein.

FIG. 14 illustrates block diagrams of example, non-limiting injection-molded solder pillar arrangements 1400 for facilitating uniform qubit chip gaps in accordance with one or more embodiments described herein. In other words, FIG. 14 depicts some exemplary, non-limiting ways in which the one or more injection-molded solder pillars 608 can be arranged on the interposer 308 so as to provide even and/or uniform support to the quantum chip 1306.

In various aspects, the injection-molded solder pillar arrangement 1402 can be implemented. As shown, the injection-molded solder pillar arrangement 1402 can include various of the one or more injection-molded solder pillars 608 being arranged at intervals along a peripheral region (e.g., perimeter) of the interposer 308, and can also include various others of the one or more injection-molded solder pillars 608 being arranged within a central region of the interposer 308. In various aspects, the one or more injection-molded solder interconnects 1008 can be within the central region of the interposer 308, as shown. Although FIG. 14 specifically depicts sixteen injection-molded solder pillars 608 along the peripheral region of the interposer 308, one injection-molded solder pillar 608 within the central region of the interposer 308, and eight injection-molded solder interconnects 1008 within the central region of the interposer 308, this is exemplary and non-limiting. In various aspects, any suitable number of injection-molded solder pillars 608 can be positioned along the peripheral region of the interposer 308, any suitable number of injection-molded solder pillars 608 can be positioned within the central region of the interposer 308, and any suitable number of injection-molded solder interconnects 1008 can be positioned within the central region of the interposer 308.

In various aspects, the injection-molded solder pillar arrangement 1404 can be implemented. As shown, the injection-molded solder pillar arrangement 1404 can include various of the one or more injection-molded solder pillars 608 being arranged in corners of the interposer 308, and can also include various others of the one or more injection-molded solder pillars 608 being arranged within a central region of the interposer 308. In various aspects, the one or more injection-molded solder interconnects 1008 can be within the central region of the interposer 308 and/or on the peripheral region of the interposer 308, as shown. Although FIG. 14 specifically depicts four injection-molded solder pillars 608 in the corners of the interposer 308, one injection-molded solder pillar 608 within the central region of the interposer 308, and twenty injection-molded solder interconnects 1008 within the central region of the interposer 308 and along the peripheral region of the interposer 308, this is exemplary and non-limiting. In various aspects, any suitable number of injection-molded solder pillars 608 can be positioned in the corners of the interposer 308, any suitable number of injection-molded solder pillars 608 can be positioned within the central region of the interposer 308, and any suitable number of injection-molded solder interconnects 1008 can be positioned within the central region of the interposer 308 and/or along the peripheral region of the interposer 308.

In various aspects, the injection-molded solder pillar arrangement 1406 can be implemented. As shown, the injection-molded solder pillar arrangement 1406 can include various of the one or more injection-molded solder pillars 608 being arranged in corners of the interposer 308, and can also include various others of the one or more injection-molded solder pillars 608 being arranged within a central region of the interposer 308. As shown, in various embodiments, the various others of the one or more injection-molded solder pillars 608 that are arranged within the central region of the interposer 308 can be in the form of extended walls of high-modulus solder material that run along the entire length and/or that run along substantially the entire length of the interposer 308 (e.g., the extended injection-molded solder pillars 608 can be long in one or more lateral dimensions, as shown). In various aspects, the one or more injection-molded solder interconnects 1008 can be within the central region of the interposer 308 and/or on the peripheral region of the interposer 308, as shown. Although FIG. 14 specifically depicts four injection-molded solder pillars 608 in the corners of the interposer 308, one extended injection-molded solder pillar 608 within the central region of the interposer 308, and sixteen injection-molded solder interconnects 1008 within the central region of the interposer 308 and along the peripheral region of the interposer 308, this is exemplary and non-limiting. In various aspects, any suitable number of injection-molded solder pillars 608 can be positioned in the corners of the interposer 308, any suitable number of extended injection-molded solder pillars 608 can be positioned within the central region of the interposer 308, and any suitable number of injection-molded solder interconnects 1008 can be positioned within the central region of the interposer 308 and/or along the peripheral region of the interposer 308.

In various aspects, the injection-molded solder pillar arrangement 1408 can be implemented. As shown, the injection-molded solder pillar arrangement 1408 can include one extended injection-molded solder pillar 608 being arranged in a continuous loop along the peripheral region of the interposer 308, and can also include various others of the one or more injection-molded solder pillars 608 being arranged within a central region of the interposer 308. As shown, in various embodiments, the extended injection-molded solder pillar 608 can run along entire peripheral region (e.g., perimeter) and/or substantially along the entire peripheral region of the interposer 308 (e.g., the extended injection-molded solder pillar 608 can be long in one or more lateral dimensions, as shown). In various aspects, the one or more injection-molded solder interconnects 1008 can be within the central region of the interposer 308, as shown.

Although FIG. 14 specifically depicts one extended injection-molded solder pillar 608 running in a contiguous loop along the peripheral region of the interposer 308, one injection-molded solder pillar 608 within the central region of the interposer 308, and eight injection-molded solder interconnects 1008 within the central region of the interposer 308, this is exemplary and non-limiting. In various aspects, any suitable number of extended injection-molded solder pillars 608 can be positioned along the peripheral region of the interposer 308 (e.g., they need not form contiguous loops in all instances), any suitable number of injection-molded solder pillars 608 can be positioned within the central region of the interposer 308, and any suitable number of injection-molded solder interconnects 1008 can be positioned within the central region of the interposer 308.

In various aspects, any other suitable injection-molded solder pillar arrangements can be implemented in various embodiments. The injection-molded solder pillar arrangements 1402-1408 are exemplary and non-limiting.

Figure 15:
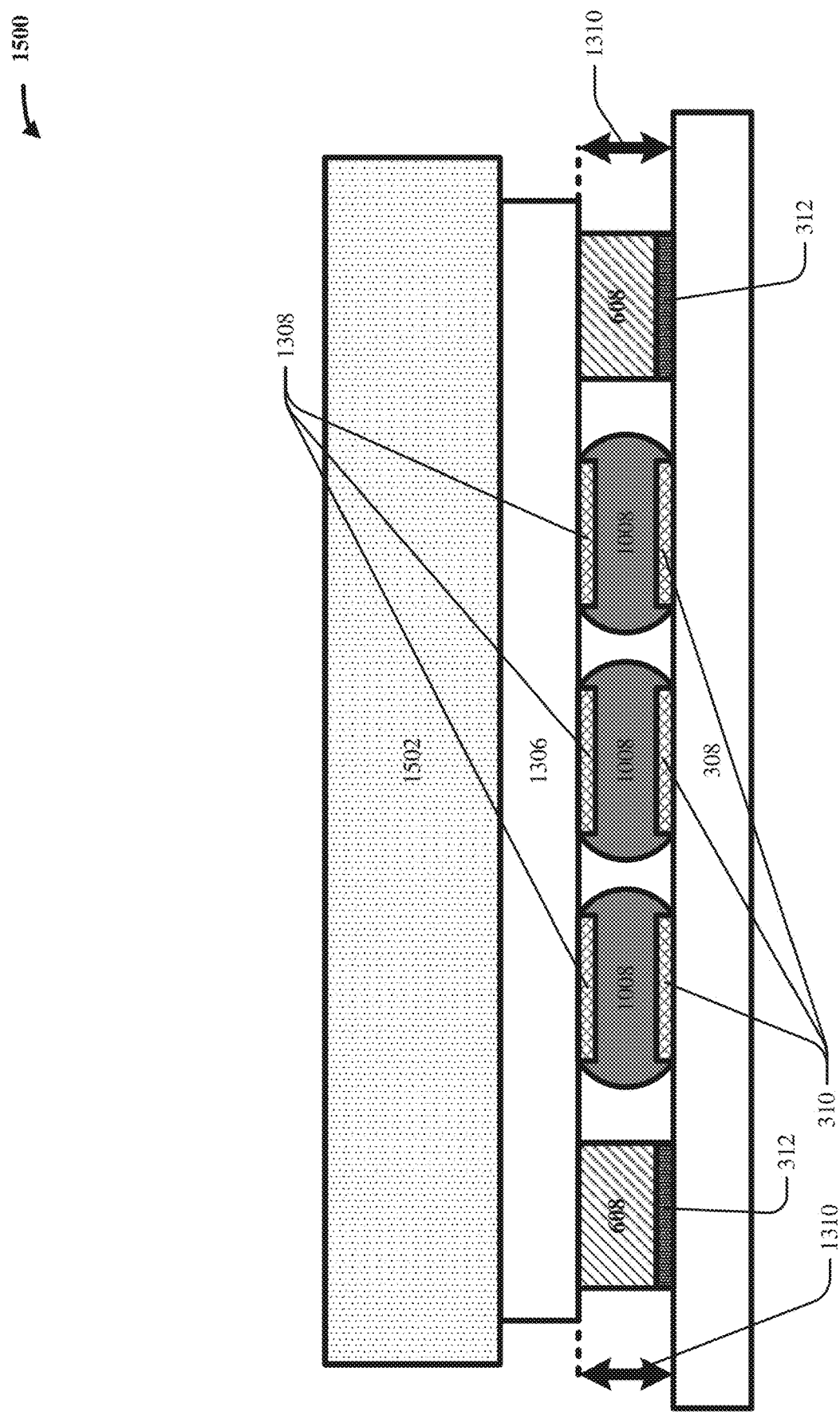
FIG. 15 illustrates a block diagram of an example, non-limiting substrate structure that shows how injection-molded solder pillars can facilitate and/or support direct thermalization schemes in accordance with one or more embodiments described herein.

FIG. 15 illustrates a block diagram of an example, non-limiting substrate structure 1500 that shows how injection-molded solder pillars can facilitate and/or support direct thermalization schemes in accordance with one or more embodiments described herein. As shown, the substrate structure 1500 can include the interposer 308, the one or more under bump metallizations 310, the one or more under bump metallizations 312, the one or more injection-molded solder pillars 608, the one or more injection-molded solder interconnects 1008, the quantum chip 1306, and the one or more under bump metallizations 1308. Again, the one or more injection-molded solder pillars 608 can maintain a desired, uniform distance 1310 between the quantum chip 1306 and the interposer 308.

As shown, in various embodiments, a heat sink 1502 can be directly pressed against the quantum chip 1306 (e.g., against the backside of the quantum chip 1306). In various aspects, the heat sink 1502 can be any suitable heat sink for use in quantum computing systems (e.g., a copper penny thermalization layer). Because the heat sink 1502 can be directly pressed against the quantum chip 1306, heat can be more efficiently transferred away from the quantum chip 1306 (e.g., without direct thermalization from the heat sink 1502, heat transfer would be facilitated only through peripherally-located solder bumps (not shown), which would be less efficient). Such a direct thermalization scheme places compressive stresses on the solder connections (e.g., 608 and 1008) between the quantum chip 1306 and the interposer 308. Without the one or more injection-molded solder pillars 608, the one or more injection-molded solder interconnects 1008 would likely experience plastic deformation and/or creep over time due to such compressive stresses, which would negatively and/or nonuniformly change the desired, uniform distance 1310. However, because the one or more injection-molded solder interconnects 1008 are in parallel with the one or more injection-molded solder pillars 608, and because the one or more injection-molded solder pillars 608 can have a high yield strength that is resistant to creep, the desired, uniform distance 1310 can remain substantially unchanged despite the compressive forces caused by the heat sink 1502. Thus, various embodiments of the invention allow for the implementation of direct thermalization schemes in situations in which direct thermalization schemes were previously impractical and/or impossible. Thus, various embodiments of the invention constitute a concrete technical improvement in the field of quantum computing fabrication.

Figure 16:
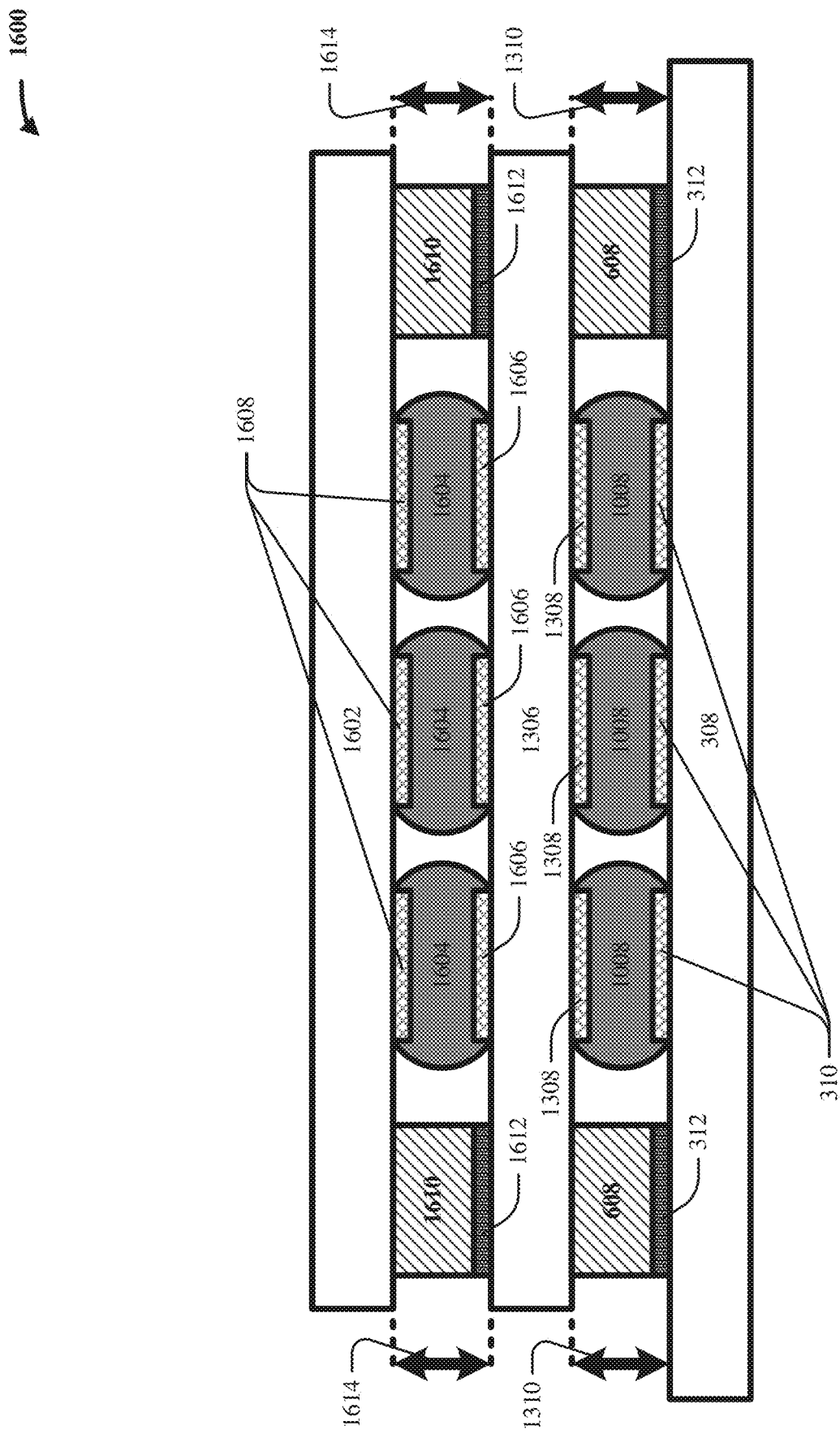
FIG. 16 illustrates a block diagram of an example, non-limiting substrate structure that shows how injection-molded solder pillars can facilitate and/or support multi-chip stacking schemes in accordance with one or more embodiments described herein.

FIG. 16 illustrates a block diagram of an example, non-limiting substrate structure 1600 that shows how injection-molded solder pillars can facilitate and/or support multi-chip stacking schemes in accordance with one or more embodiments described herein. As shown, the substrate structure 1600 can include the interposer 308, the one or more under bump metallizations 310, the one or more under bump metallizations 312, the one or more injection-molded solder pillars 608, the one or more injection-molded solder interconnects 1008, the quantum chip 1306, and the one or more under bump metallizations 1308. Again, the one or more injection-molded solder pillars 608 can maintain a desired, uniform distance 1310 between the quantum chip 1306 and the interposer 308.

As shown, in various embodiments, the substrate structure 1600 can further include a quantum chip 1602 that is stacked on top of the quantum chip 1306. Specifically, in various aspects, the backside of the quantum chip 1306 can include one or more under bump metallizations 1606 (e.g., of any suitable sizes, shapes, dimensions, and/or materials as described above), and these can correspond to one or more under bump metallizations 1608 on the quantum chip 1602. In various cases, the one or more under bump metallizations 1606 can be coupled to the one or more under bump metallizations 1608 via one or more injection-molded solder interconnects 1604 (e.g., having any suitable sizes, shapes, dimensions, and/or materials as described above). Furthermore, as shown, there can be one or more injection-molded solder pillars 1610 (e.g., having any suitable sizes, shapes, dimensions, and/or materials as described above) between the quantum chip 1602 and the quantum chip 1306. In various aspects, the one or more injection-molded solder pillars 1610 can be formed on one or more under bump metallizations 1612 on the backside of the quantum chip 1306. Substantially as described above, the one or more injection-molded solder pillars 1610 can maintain a desired, uniform distance 1614 between the quantum chip 1602 and the quantum chip 1306. In other words, the one or more injection-molded solder pillars 608 and/or 1610 can help to facilitate chip stacking schemes in quantum computing systems (e.g., the quantum chip 1602 is stacked on top of the quantum chip 1306, which is stacked on top of the interposer 308). In such chip-stacking schemes, significant compressive stresses can be experienced within the connections between each chip (e.g., the connections between the quantum chip 1602 and the quantum chip 1306 can experience compressive stresses, and the connections between the quantum chip 1306 and the interposer 308 can experience even larger compressive stresses due to the weight and/or fabrication of the quantum chip 1602). Without the one or more injection-molded solder pillars 608, such a chip-stacking scheme would cause excessive deformation and/or creep within the one or more injection-molded solder interconnects 1008. However, because the one or more injection-molded solder interconnects 1008 are in parallel with the one or more injection-molded solder pillars 608, and because the one or more injection-molded solder pillars 608 can have a high yield strength that is resistant to creep, the desired, uniform distance 1310 can remain substantially unchanged despite the compressive forces caused by the depicted chip-stacking scheme. Thus, various embodiments of the invention allow for the implementation of chip-stacking schemes in situations in which chip-stacking schemes were previously impractical and/or impossible. Thus, various embodiments of the invention constitute a concrete technical improvement in the field of quantum computing fabrication.

In various aspects, although FIG. 16 depicts a chip-stacking scheme involving only two quantum chips (e.g., 1306 and 1602), this is exemplary and non-limiting. In various embodiments, any suitable number of quantum chips can be stacked when injection-molded solder pillars are implemented.

Although FIG. 16 depicts the desired, uniform distance 1614 as being equal to the desired, uniform distance 1310, this is exemplary and non-limiting. In various aspects, different uniform gaps between stacked chips can be implemented.

In various aspects, embodiments of the invention can help to facilitate any other quantum chip packaging scheme that involves compressively loading solder connections between chips. An exemplary, non-limiting example of such a scheme can be input/output area array sockets. Since input/output area array sockets can require a load to engage spring contacts, one or more injection-molded solder pillars can be implemented to support that load and thereby prevent creep and/or nonuniform chip gaps. Other exemplary, non-limiting examples can include chip packaging schemes that involve packaging pennies, packaging covers, and/or printed circuit boards that apply compressive loads to solder connections between an interposer chip and one or more qubit chips.

Figure 17:
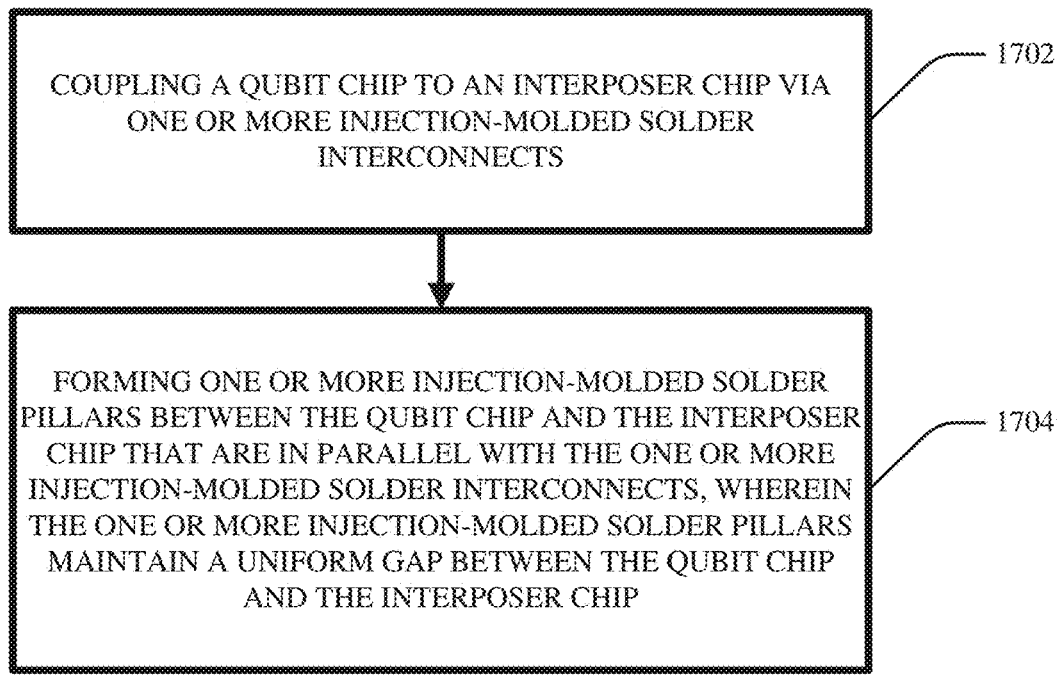
FIG. 17 illustrates a flow diagram of an example, non-limiting method that facilitates uniform qubit chip gaps via injection-molded solder pillars in accordance with one or more embodiments described herein.

FIG. 17 illustrates a flow diagram of an example, non-limiting method 1700 that facilitates uniform qubit chip gaps via injection-molded solder pillars in accordance with one or more embodiments described herein.

In various embodiments, act 1702 can include coupling a qubit chip (e.g., 106 and/or 1306) to an interposer chip (e.g., 108 and/or 308) via one or more injection molded solder interconnects (e.g., 110 and/or 1008).

In various instances, act 1704 can include forming (e.g., via injection-molded soldering) one or more injection-molded solder pillars (e.g., 120 and/or 608) between the qubit chip and the interposer chip. In various aspects, the one or more injection-molded solder pillars can be in parallel with the one or more injection-molded solder interconnects. In various cases, the one or more injection-molded solder pillars can maintain a uniform gap (e.g., 124 and/or 1310) between the qubit chip and the interposer chip.

In various instances, cold welding of indium/indium and/or indium/gold at room temperature can be implemented in qubit flip-chip packaging due to Josephson junction temperature constraints. Although indium is easy to cold weld, it is very prone to creep and plastic deformation. Solder creep can alter a bonding gap between a qubit chip and an interposer chip that are bonded in a flip-chip arrangement, which can thereby negatively affect capacitances of qubits on the qubit chip and/or other microwave circuit components on the qubit chip. In some cases, creeping and/or nonuniform bonding gaps can cause shorting of signals and/or shorting of resonators, which is detrimental to quantum performance. Most other low temperature soldering materials also suffer from this creep and/or deformation vulnerability. Such low temperature soldering materials thus prevent quantum computing systems from operating under compression, which can severely limit quantum chip packaging schemes (e.g., direct thermalization cannot be used, area array sockets cannot be used, chip stacking cannot be used).

Various embodiments of the invention can address and/or solve one or more of these problems. In various cases, two different types of soldering materials/structures can be injection-molded soldered between the qubit chip and the interposer chip. In various cases, the first type of soldering material/structure can be the one or more injection-molded solder backstops, and the second type of soldering material/structure can be the one or more injection-molded solder bumps. In various cases, the composition of the one or more injection-molded solder backstops can be chosen and/or selected to exhibit a high yield strength and a high melting temperature (e.g., tertiary, quaternary, and/or quinary tin alloys), which can prevent the one or more injection-molded solder backstops from plastically deforming during cold welding and/or low temperature reflow soldering. By resisting plastic deformation, the one or more injection-molded solder backstops can act as physical barriers which prevent the qubit chip from getting closer than a predetermined and/or threshold distance to the interposer chip (e.g., that distance can be substantially equal to the height of the one or more injection-molded solder backstops). The high yield strength can allow the one or more injection-molded solder backstops to have minimal and/or arbitrarily-shaped cross-sectional areas (e.g., thereby saving chip real estate). In various cases, the one or more injection-molded solder backstops can be formed without seed layers, can be formed after wiring patterning, and can exhibit superconductivity (e.g., so as to not interfere with capacitance and/or coherence values of the qubit chip). In various cases, the one or more injection-molded solder backstops can be in parallel with the one or more injection-molded solder bumps (e.g., the one or more injection-molded solder backstops can be at one or more locations on the interposer chip, and the one or more injection-molded solder bumps can be at one or more different locations on the interposer chip, such that the one or more injection-molded solder backstops are not directly stacked on top of the one or more injection-molded solder bumps and/or vice verse). Moreover, the one or more injection-molded solder backstops can, in various instances, allow for application of compressive loads on flip-chip packages without altering gap height and/or without being vulnerable to creep. Moreover, when tertiary, quaternary, and/or quinary tin alloys are implemented, the one or more injection-molded solder backstops can exhibit high resilience and low brittleness. In various cases, the one or more injection-molded solder backstops can exhibit a non-round-top shape, whereas the one or more injection-molded solder bumps can exhibit a round-top shape (e.g., reflow can be applied at a temperature that is below the melting temperature of the one or more injection-molded solder backstops, and that is above the melting temperature of the one or more injection-molded solder bumps).

In various embodiments, injection-molded solder pillars and/or injection-molded solder backstops as described herein can be used to maintain and/or facilitate uniform gaps between an interposer chip and any suitable number of qubit chips and/or to facilitate uniform gaps between stacked qubit chips (e.g., multiple stacked qubit chips can be bonded to an interposer chip, multiple unstacked qubit chips can be bonded to an interposer chip, and/or any suitable combination of stacked and/or unstacked qubit chips can be bonded to an interposer chip).

Figure 18:
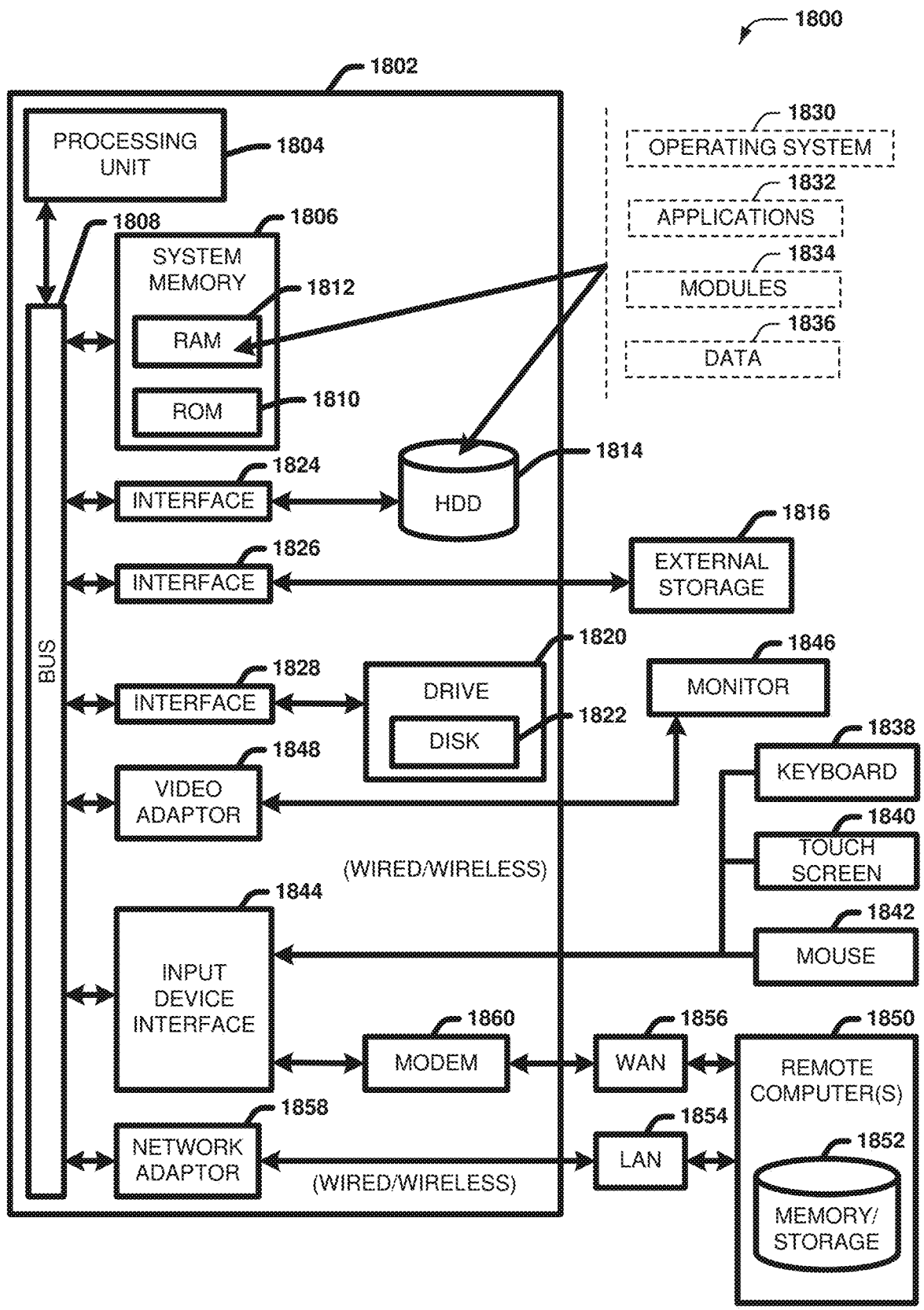
FIG. 18 illustrates a block diagram of an example, non-limiting operating environment in which one or more embodiments described herein can be facilitated.

In order to provide additional context for various embodiments described herein, FIG. 18 and the following discussion are intended to provide a brief, general description of a suitable computing environment 1800 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 18, the example environment 1800 for implementing various embodiments of the aspects described herein includes a computer 1802, the computer 1802 including a processing unit 1804, a system memory 1806 and a system bus 1808. The system bus 1808 couples system components including, but not limited to, the system memory 1806 to the processing unit 1804. The processing unit 1804 can be any of various commercially available processors. Dual microprocessors and other multi-processor architectures can also be employed as the processing unit 1804.

The system bus 1808 can be any of several types of bus structure that can further interconnect to a memory bus (with or without a memory controller), a peripheral bus, and a local bus using any of a variety of commercially available bus architectures. The system memory 1806 includes ROM 1810 and RAM 1812. A basic input/output system (BIOS) can be stored in a non-volatile memory such as ROM, erasable programmable read only memory (EPROM), EEPROM, which BIOS contains the basic routines that help to transfer information between elements within the computer 1802, such as during startup. The RAM 1812 can also include a high-speed RAM such as static RAM for caching data.

The computer 1802 further includes an internal hard disk drive (HDD) 1814 (e.g., EIDE, SATA), one or more external storage devices 1816 (e.g., a magnetic floppy disk drive (FDD) 1816, a memory stick or flash drive reader, a memory card reader, etc.) and a drive 1820, e.g., such as a solid state drive, an optical disk drive, which can read or write from a disk 1822, such as a CD-ROM disc, a DVD, a BD, etc. Alternatively, where a solid state drive is involved, disk 1822 would not be included, unless separate. While the internal HDD 1814 is illustrated as located within the computer 1802, the internal HDD 1814 can also be configured for external use in a suitable chassis (not shown). Additionally, while not shown in environment 1800, a solid state drive (SSD) could be used in addition to, or in place of, an HDD 1814. The HDD 1814, external storage device(s) 1816 and drive 1820 can be connected to the system bus 1808 by an HDD interface 1824, an external storage interface 1826 and a drive interface 1828, respectively. The interface 1824 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 1802, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1812, including an operating system 1830, one or more application programs 1832, other program modules 1834 and program data 1836. All or portions of the operating system, applications, modules, and/or data can also be cached in the RAM 1812. The systems and methods described herein can be implemented utilizing various commercially available operating systems or combinations of operating systems.

Computer 1802 can optionally comprise emulation technologies. For example, a hypervisor (not shown) or other intermediary can emulate a hardware environment for operating system 1830, and the emulated hardware can optionally be different from the hardware illustrated in FIG. 18. In such an embodiment, operating system 1830 can comprise one virtual machine (VM) of multiple VMs hosted at computer 1802. Furthermore, operating system 1830 can provide runtime environments, such as the Java runtime environment or the .NET framework, for applications 1832. Runtime environments are consistent execution environments that allow applications 1832 to run on any operating system that includes the runtime environment. Similarly, operating system 1830 can support containers, and applications 1832 can be in the form of containers, which are lightweight, standalone, executable packages of software that include, e.g., code, runtime, system tools, system libraries and settings for an application.

Further, computer 1802 can be enable with a security module, such as a trusted processing module (TPM). For instance with a TPM, boot components hash next in time boot components, and wait for a match of results to secured values, before loading a next boot component. This process can take place at any layer in the code execution stack of computer 1802, e.g., applied at the application execution level or at the operating system (OS) kernel level, thereby enabling security at any level of code execution.

A user can enter commands and information into the computer 1802 through one or more wired/wireless input devices, e.g., a keyboard 1838, a touch screen 1840, and a pointing device, such as a mouse 1842. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1804 through an input device interface 1844 that can be coupled to the system bus 1808, but can be connected by other interfaces, such as a parallel port, an IEEE 1394 serial port, a game port, a USB port, an IR interface, a BLUETOOTH® interface, etc.

A monitor 1846 or other type of display device can be also connected to the system bus 1808 via an interface, such as a video adapter 1848. In addition to the monitor 1846, a computer typically includes other peripheral output devices (not shown), such as speakers, printers, etc.

The computer 1802 can operate in a networked environment using logical connections via wired and/or wireless communications to one or more remote computers, such as a remote computer(s) 1850. The remote computer(s) 1850 can be a workstation, a server computer, a router, a personal computer, portable computer, microprocessor-based entertainment appliance, a peer device or other common network node, and typically includes many or all of the elements described relative to the computer 1802, although, for purposes of brevity, only a memory/storage device 1852 is illustrated. The logical connections depicted include wired/wireless connectivity to a local area network (LAN) 1854 and/or larger networks, e.g., a wide area network (WAN) 1856. Such LAN and WAN networking environments are commonplace in offices and companies, and facilitate enterprise-wide computer networks, such as intranets, all of which can connect to a global communications network, e.g., the Internet.

When used in a LAN networking environment, the computer 1802 can be connected to the local network 1854 through a wired and/or wireless communication network interface or adapter 1858. The adapter 1858 can facilitate wired or wireless communication to the LAN 1854, which can also include a wireless access point (AP) disposed thereon for communicating with the adapter 1858 in a wireless mode.

When used in a WAN networking environment, the computer 1802 can include a modem 1860 or can be connected to a communications server on the WAN 1856 via other means for establishing communications over the WAN 1856, such as by way of the Internet. The modem 1860, which can be internal or external and a wired or wireless device, can be connected to the system bus 1808 via the input device interface 1844. In a networked environment, program modules depicted relative to the computer 1802 or portions thereof, can be stored in the remote memory/storage device 1852. It will be appreciated that the network connections shown are example and other means of establishing a communications link between the computers can be used.

When used in either a LAN or WAN networking environment, the computer 1802 can access cloud storage systems or other network-based storage systems in addition to, or in place of, external storage devices 1816 as described above, such as but not limited to a network virtual machine providing one or more aspects of storage or processing of information. Generally, a connection between the computer 1802 and a cloud storage system can be established over a LAN 1854 or WAN 1856 e.g., by the adapter 1858 or modem 1860, respectively. Upon connecting the computer 1802 to an associated cloud storage system, the external storage interface 1826 can, with the aid of the adapter 1858 and/or modem 1860, manage storage provided by the cloud storage system as it would other types of external storage. For instance, the external storage interface 1826 can be configured to provide access to cloud storage sources as if those sources were physically connected to the computer 1802.

The computer 1802 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adaptor card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   electrically coupling at least one qubit chip to an interposer chip via one or more injection-molded solder interconnects;
   forming one or more injection-molded solder pillars between the at least one qubit chip and the interposer chip, wherein the injection-molded solder pillars are in parallel with and outside on both sides of the one or more injection-molded solder interconnects;
   forming a first plurality of under bump metallizations (UBMs) on the at least one qubit chip;
   forming a second plurality of the UBMs on the interposer chip;
   forming a third plurality of the UBMs on the interposer chip;
   attaching the qubit chip to the interposer chip such that:
      a plurality of the injection-molded solder interconnects are in contact with the first plurality of UBMs on a first end of the one or more injection-molded solder interconnects and in contact with the second plurality of UBMs on a second end of the one or more injection-molded solder interconnects; and
      a plurality of the one or more injection-molded solder pillars are in contact with the third plurality of UBMs on a first end of the one or more injection-molded solder pillars, wherein the third plurality of UBMs is directly adjacent the interposer chip.

2. The method of claim 1, wherein the one or more injection-molded solder pillars maintain a uniform gap between the at least one qubit chip and the interposer chip.

3. The method of claim 2, wherein a melting point of the one or more injection-molded solder pillars is higher than a melting point of the one or more injection-molded solder interconnects.

4. The method of claim 3, wherein the one or more injection-molded solder pillars are superconductors.

5. The method of claim 4, wherein a yield strength of the one or more injection-molded solder pillars is between 3,000 pounds per square inch and 15,000 pounds per square inch, and is higher than a yield strength of the one or more injection-molded solder interconnects.

6. The method of claim 5, wherein the one or more injection-molded solder pillars are binary tin alloys, tertiary tin alloys, or quaternary tin alloys.

7. The method of claim 6, wherein the one or more injection-molded solder pillars support the at least one qubit chip in a direct thermalization packaging scheme, in a chip stacking packaging scheme, or in an area array socket packaging scheme.

8. The method of claim 6, wherein the one or more injection-molded solder pillars are located in corners of the interposer chip, or are formed in a continuous loop along a perimeter of the interposer chip.

* * * * *